US008415670B2

(12) United States Patent
Im

(10) Patent No.: US 8,415,670 B2
(45) Date of Patent: Apr. 9, 2013

(54) METHODS OF PRODUCING HIGH UNIFORMITY IN THIN FILM TRANSISTOR DEVICES FABRICATED ON LATERALLY CRYSTALLIZED THIN FILMS

(75) Inventor: James S. Im, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 12/679,543

(22) PCT Filed: Sep. 25, 2008

(86) PCT No.: PCT/US2008/077704
§ 371 (c)(1),
(2), (4) Date: Jun. 16, 2010

(87) PCT Pub. No.: WO2009/042784
PCT Pub. Date: Apr. 2, 2009

(65) Prior Publication Data
US 2010/0270557 A1 Oct. 28, 2010

Related U.S. Application Data

(60) Provisional application No. 60/995,199, filed on Sep. 25, 2007.

(51) Int. Cl.
*H01L 29/786* (2006.01)
(52) U.S. Cl.
USPC 257/66; 257/E29.292; 438/795; 438/E21.328
(58) Field of Classification Search .................. 257/66, 257/E29.292, E21.328; 438/795
See application file for complete search history.

(56) References Cited

U.S. PATENT DOCUMENTS 3,632,205 A 1/1972 Marcy et al.
4,234,358 A 11/1980 Celler et al.
(Continued)

FOREIGN PATENT DOCUMENTS

CN 1495848 A 5/2004
DE 19839718 3/2000
(Continued)

OTHER PUBLICATIONS

Bergmann, R. et al., Nucleation and Growth of Crystalline Silicon Films on Glass for Solar Cells, Phys. Stat. Sol., 1998, pp. 587-602, vol. 166, Germany.

(Continued)

*Primary Examiner* — Zandra Smith
*Assistant Examiner* — Paul Patton
(74) *Attorney, Agent, or Firm* — Wilmer Cutler Pickering Hale and Dorr LLP

(57) ABSTRACT

Methods of producing high uniformity in thin film transistor devices fabricated on laterally crystallized thin films are described. A thin film transistor (TFT) includes a channel area disposed in a crystalline substrate, which has grain boundaries that are approximately parallel with each other and are spaced apart with approximately equal spacings. The shape of the channel area includes a non-equiangular polygon that has two opposing side edges that are oriented substantially perpendicular to the grain boundaries. The polygon further has an upper edge and a lower edge. At least a portion of each of the upper and lower edges is oriented at a tilt angle with respect to the grain boundaries. The tilt angles are selected such that the number of grain boundaries covered by the polygon is independent of the location of the channel area within the crystalline substrate.

21 Claims, 11 Drawing Sheets

U.S. PATENT DOCUMENTS

| | | |
|---|---|---|
| 4,309,225 A | 1/1982 | Fan et al. |
| 4,382,658 A | 5/1983 | Shields et al. |
| 4,456,371 A | 6/1984 | Lin |
| 4,639,277 A | 1/1987 | Hawkins |
| 4,653,903 A | 3/1987 | Torigoe et al. |
| 4,691,983 A | 9/1987 | Kobayashi et al. |
| 4,727,047 A | 2/1988 | Bozler et al. |
| 4,758,533 A | 7/1988 | Magee et al. |
| 4,793,694 A | 12/1988 | Liu |
| 4,800,179 A | 1/1989 | Mukai |
| 4,855,014 A | 8/1989 | Kakimoto et al. |
| 4,870,031 A | 9/1989 | Sugahara et al. |
| 4,940,505 A | 7/1990 | Schachameyer et al. |
| 4,970,546 A | 11/1990 | Suzuki et al. |
| 4,977,104 A | 12/1990 | Sawada et al. |
| 5,032,233 A | 7/1991 | Yu et al. |
| 5,061,655 A | 10/1991 | Ipposhi et al. |
| 5,076,667 A | 12/1991 | Stewart et al. |
| RE33,836 E | 3/1992 | Resor, III et al. |
| 5,145,808 A | 9/1992 | Sameshima et al. |
| 5,173,441 A | 12/1992 | Yu et al. |
| 5,204,659 A | 4/1993 | Sarma |
| 5,233,207 A | 8/1993 | Anzai et al. |
| 5,247,375 A | 9/1993 | Mochizuki et al. |
| 5,281,840 A | 1/1994 | Sarma |
| 5,285,236 A | 2/1994 | Jain |
| 5,291,240 A | 3/1994 | Jain |
| 5,294,811 A | 3/1994 | Aoyama et al. |
| 5,304,357 A | 4/1994 | Sato et al. |
| 5,338,959 A | 8/1994 | Kim et al. |
| 5,373,803 A | 12/1994 | Noguchi et al. |
| 5,395,481 A | 3/1995 | McCarthy |
| 5,409,867 A | 4/1995 | Asano et al. |
| 5,453,594 A | 9/1995 | Konecny |
| 5,456,763 A | 10/1995 | Kaschmitter et al. |
| 5,496,768 A | 3/1996 | Kudo et al. |
| 5,512,494 A | 4/1996 | Tanabe et al. |
| 5,523,193 A | 6/1996 | Nelson |
| 5,529,951 A | 6/1996 | Noguchi et al. |
| 5,571,430 A | 11/1996 | Kawasaki et al. |
| 5,591,668 A | 1/1997 | Maegawa et al. |
| 5,663,579 A | 9/1997 | Noguchi |
| 5,683,935 A | 11/1997 | Miyamoto et al. |
| 5,710,050 A | 1/1998 | Makita et al. |
| 5,721,606 A | 2/1998 | Jain |
| 5,742,426 A | 4/1998 | York |
| 5,756,364 A | 5/1998 | Tanaka et al. |
| 5,766,989 A | 6/1998 | Maegawa et al. |
| 5,767,003 A | 6/1998 | Noguchi |
| 5,817,548 A | 10/1998 | Noguchi et al. |
| 5,844,588 A | 12/1998 | Anderson |
| 5,858,807 A | 1/1999 | Kawamura |
| 5,861,991 A | 1/1999 | Fork |
| 5,893,990 A | 4/1999 | Tanaka et al. |
| 5,948,172 A | 9/1999 | Neiheisel |
| 5,948,291 A | 9/1999 | Neylan et al. |
| 5,960,323 A | 9/1999 | Wakita et al. |
| 5,986,807 A | 11/1999 | Fork |
| 6,002,523 A | 12/1999 | Tanaka |
| 6,014,944 A | 1/2000 | Aklufi et al. |
| 6,020,224 A | 2/2000 | Shimogaichi et al. |
| 6,020,244 A | 2/2000 | Thompson et al. |
| 6,045,980 A | 4/2000 | Edelkind et al. |
| 6,072,631 A | 6/2000 | Guenther et al. |
| 6,081,381 A | 6/2000 | Shalapenok et al. |
| 6,117,752 A | 9/2000 | Suzuki et al. |
| 6,120,976 A | 9/2000 | Treadwell et al. |
| 6,130,009 A | 10/2000 | Smith et al. |
| 6,130,455 A | 10/2000 | Yoshinouchi et al. |
| 6,135,632 A | 10/2000 | Flint |
| 6,136,632 A | 10/2000 | Higashi |
| 6,156,997 A | 12/2000 | Yamazaki et al. |
| 6,162,711 A | 12/2000 | Ma et al. |
| 6,169,014 B1 | 1/2001 | McCulloch et al. |
| 6,172,820 B1 | 1/2001 | Kuwahara et al. |
| 6,176,922 B1 | 1/2001 | Aklufi et al. |
| 6,177,301 B1 | 1/2001 | Jung et al. |
| 6,184,490 B1 | 2/2001 | Schweizer |
| 6,187,088 B1 | 2/2001 | Okumura et al. |
| 6,190,985 B1 | 2/2001 | Buynoski |
| 6,193,796 B1 | 2/2001 | Yang et al. |
| 6,203,952 B1 | 3/2001 | O'Brien et al. |
| 6,235,614 B1 | 5/2001 | Yang et al. |
| 6,242,291 B1 | 6/2001 | Kusumoto et al. |
| 6,274,488 B1 | 8/2001 | Talwar et al. |
| 6,285,001 B1 | 9/2001 | Fleming et al. |
| 6,300,175 B1 | 10/2001 | Moon et al. |
| 6,313,435 B1 | 11/2001 | Shoemaker et al. |
| 6,316,338 B1 | 11/2001 | Jung et al. |
| 6,320,227 B1 | 11/2001 | Lee et al. |
| 6,322,625 B2 | 11/2001 | Im |
| 6,326,186 B1 | 12/2001 | Kirk et al. |
| 6,326,215 B1 | 12/2001 | Keen |
| 6,326,286 B1 | 12/2001 | Park et al. |
| 6,333,232 B1 | 12/2001 | Kunikiyo et al. |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,387,178 B1 | 5/2002 | Geho et al. |
| 6,388,146 B1 | 5/2002 | Onishi et al. |
| 6,388,386 B1 | 5/2002 | Kunii et al. |
| 6,392,810 B1 | 5/2002 | Tanaka et al. |
| 6,393,042 B1 | 5/2002 | Tanaka et al. |
| 6,407,012 B1 | 6/2002 | Miyasaka et al. |
| 6,410,373 B1 | 6/2002 | Chang et al. |
| 6,429,100 B2 | 8/2002 | Yoneda et al. |
| 6,432,758 B1 | 8/2002 | Cheng et al. |
| 6,437,284 B1 | 8/2002 | Okamoto et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka |
| 6,472,684 B1 | 10/2002 | Yamazaki et al. |
| 6,476,447 B1 | 11/2002 | Yamazaki et al. |
| 6,479,837 B1 | 11/2002 | Ogawa et al. |
| 6,482,722 B2 | 11/2002 | Kunii et al. |
| 6,493,042 B1 | 12/2002 | Bozdagi et al. |
| 6,495,067 B1 | 12/2002 | Ono et al. |
| 6,495,405 B2 | 12/2002 | Voutsas et al. |
| 6,501,095 B2 | 12/2002 | Yamaguchi et al. |
| 6,504,175 B1 | 1/2003 | Mei et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka et al. |
| 6,516,009 B1 | 2/2003 | Tanaka et al. |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,531,681 B1 | 3/2003 | Markle et al. |
| 6,535,535 B1 | 3/2003 | Yamazaki et al. |
| 6,555,422 B1 | 4/2003 | Yamazaki et al. |
| 6,555,449 B1 | 4/2003 | Im et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Sposili et al. |
| 6,582,827 B1 | 6/2003 | Im |
| 6,590,228 B2 | 7/2003 | Voutsas et al. |
| 6,608,326 B1 | 8/2003 | Shinagawa et al. |
| 6,621,044 B2 | 9/2003 | Jain et al. |
| 6,635,554 B1 | 10/2003 | Im et al. |
| 6,635,932 B2 | 10/2003 | Grigoropoulos et al. |
| 6,667,198 B2 | 12/2003 | Shimoto et al. |
| 6,693,258 B2 | 2/2004 | Sugano et al. |
| 6,734,635 B2 | 5/2004 | Kunii et al. |
| 6,741,621 B2 | 5/2004 | Asano |
| 6,750,424 B2 | 6/2004 | Tanaka |
| 6,755,909 B2 | 6/2004 | Jung |
| 6,784,455 B2 | 8/2004 | Maekawa et al. |
| 6,830,993 B1 | 12/2004 | Im et al. |
| 6,858,477 B2 | 2/2005 | Deane et al. |
| 6,860,939 B2 | 3/2005 | Hartzell |

| | | |
|---|---|---|
| 6,908,835 B2 | 6/2005 | Sposili et al. |
| 6,916,690 B2 | 7/2005 | Chang |
| 6,961,117 B2 | 11/2005 | Im |
| 6,962,860 B2 | 11/2005 | Yamazaki et al. |
| 6,984,573 B2 | 1/2006 | Yamazaki et al. |
| 7,029,996 B2 | 4/2006 | Im et al. |
| 7,078,281 B2 | 7/2006 | Tanaka et al. |
| 7,078,793 B2 | 7/2006 | Ruckerbauer et al. |
| 7,091,411 B2 | 8/2006 | Falk et al. |
| 7,115,503 B2 | 10/2006 | Im |
| 7,119,365 B2 | 10/2006 | Takafuji et al. |
| 7,132,204 B2 | 11/2006 | Jung |
| 7,144,793 B2 | 12/2006 | Gosain et al. |
| 7,160,763 B2 | 1/2007 | Im et al. |
| 7,164,152 B2 | 1/2007 | Im |
| 7,172,952 B2 | 2/2007 | Chung |
| 7,183,229 B2 | 2/2007 | Yamanaka |
| 7,187,016 B2 * | 3/2007 | Arima ......................... 257/213 |
| 7,189,624 B2 | 3/2007 | Ito |
| 7,192,479 B2 | 3/2007 | Mitani et al. |
| 7,192,818 B1 | 3/2007 | Lee et al. |
| 7,199,397 B2 | 4/2007 | Huang et al. |
| 7,217,605 B2 | 5/2007 | Kawasaki et al. |
| 7,220,660 B2 | 5/2007 | Im et al. |
| 7,297,982 B2 | 11/2007 | Suzuki et al. |
| 7,311,778 B2 | 12/2007 | Im et al. |
| 7,318,866 B2 | 1/2008 | Im |
| 7,326,876 B2 | 2/2008 | Jung |
| 7,364,952 B2 | 4/2008 | Im |
| 7,399,359 B2 | 7/2008 | Im et al. |
| 7,622,370 B2 | 11/2009 | Im |
| 7,629,234 B2 | 12/2009 | Bruland |
| 7,645,337 B2 | 1/2010 | Im et al. |
| 7,691,687 B2 | 4/2010 | Im |
| 7,700,462 B2 | 4/2010 | Tanaka et al. |
| 7,709,378 B2 | 5/2010 | Im |
| 7,804,647 B2 | 9/2010 | Mitani et al. |
| 7,964,480 B2 | 6/2011 | Im et al. |
| 2001/0001745 A1 | 5/2001 | Im et al. |
| 2001/0029089 A1 | 10/2001 | Tanaka |
| 2001/0030292 A1 | 10/2001 | Brotherton |
| 2001/0041426 A1 | 11/2001 | Im |
| 2002/0083557 A1 | 7/2002 | Jung |
| 2002/0104750 A1 | 8/2002 | Ito |
| 2002/0119609 A1 | 8/2002 | Hatano et al. |
| 2002/0151115 A1 | 10/2002 | Nakajima et al. |
| 2002/0179004 A1 | 12/2002 | Jung |
| 2002/0197778 A1 | 12/2002 | Kasahara et al. |
| 2003/0006221 A1 | 1/2003 | Hong et al. |
| 2003/0013278 A1 | 1/2003 | Jang et al. |
| 2003/0013280 A1 | 1/2003 | Yamanaka |
| 2003/0022471 A1 | 1/2003 | Taketomi et al. |
| 2003/0029212 A1 | 2/2003 | Im |
| 2003/0057418 A1 | 3/2003 | Asano |
| 2003/0060026 A1 | 3/2003 | Yamazaki et al. |
| 2003/0068836 A1 | 4/2003 | Hongo et al. |
| 2003/0088848 A1 | 5/2003 | Crowder |
| 2003/0096489 A1 | 5/2003 | Im et al. |
| 2003/0104682 A1 | 6/2003 | Hara et al. |
| 2003/0119286 A1 | 6/2003 | Im et al. |
| 2003/0148565 A1 | 8/2003 | Yamanaka |
| 2003/0148594 A1 | 8/2003 | Yamazaki et al. |
| 2003/0183270 A1 | 10/2003 | Falk et al. |
| 2003/0194613 A1 | 10/2003 | Voutsas et al. |
| 2003/0196589 A1 | 10/2003 | Mitani et al. |
| 2003/0218171 A1 | 11/2003 | Isobe et al. |
| 2004/0041158 A1 | 3/2004 | Hongo et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0209447 A1 | 10/2004 | Gosain et al. |
| 2004/0222187 A1 | 11/2004 | Lin |
| 2004/0224487 A1 | 11/2004 | Yang |
| 2005/0003591 A1 | 1/2005 | Takaoka et al. |
| 2005/0032249 A1 | 2/2005 | Im et al. |
| 2005/0034653 A1 | 2/2005 | Im et al. |
| 2005/0059222 A1 | 3/2005 | You |
| 2005/0059223 A1 | 3/2005 | Im |
| 2005/0059224 A1 | 3/2005 | Im |
| 2005/0059265 A1 | 3/2005 | Im |
| 2005/0112906 A1 | 5/2005 | Maekawa et al. |
| 2005/0139830 A1 | 6/2005 | Takeda et al. |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2005/0235903 A1 | 10/2005 | Im et al. |
| 2005/0236908 A1 | 10/2005 | Rivin |
| 2005/0255640 A1 | 11/2005 | Im et al. |
| 2005/0282319 A1 | 12/2005 | Bruland et al. |
| 2006/0030164 A1 | 2/2006 | Im |
| 2006/0035478 A1 | 2/2006 | You |
| 2006/0040512 A1 | 2/2006 | Im |
| 2006/0060130 A1 | 3/2006 | Im |
| 2006/0102901 A1 | 5/2006 | Im et al. |
| 2006/0125741 A1 | 6/2006 | Tanaka et al. |
| 2006/0134890 A1 | 6/2006 | Im |
| 2006/0211183 A1 | 9/2006 | Duan et al. |
| 2006/0254500 A1 | 11/2006 | Im et al. |
| 2007/0007242 A1 * | 1/2007 | Im .................................. 216/62 |
| 2007/0010074 A1 | 1/2007 | Im |
| 2007/0010104 A1 | 1/2007 | Im et al. |
| 2007/0012664 A1 | 1/2007 | Im |
| 2007/0020942 A1 | 1/2007 | Im |
| 2007/0032096 A1 | 2/2007 | Im |
| 2007/0051302 A1 | 3/2007 | Gosain et al. |
| 2007/0054477 A1 | 3/2007 | Kim et al. |
| 2007/0108472 A1 | 5/2007 | Jeong et al. |
| 2007/0111349 A1 | 5/2007 | Im |
| 2007/0145017 A1 | 6/2007 | Im et al. |
| 2007/0184638 A1 | 8/2007 | Kang et al. |
| 2007/0215877 A1 | 9/2007 | Kato et al. |
| 2007/0215942 A1 * | 9/2007 | Chen et al. ................... 257/347 |
| 2008/0035863 A1 | 2/2008 | Im et al. |
| 2008/0124526 A1 | 5/2008 | Im |
| 2008/0176414 A1 | 7/2008 | Im |
| 2009/0001523 A1 | 1/2009 | Im |
| 2009/0137105 A1 | 5/2009 | Im |
| 2009/0140173 A1 | 6/2009 | Im |
| 2009/0218577 A1 | 9/2009 | Im |
| 2009/0242805 A1 | 10/2009 | Im |
| 2009/0309104 A1 | 12/2009 | Im et al. |
| 2010/0024865 A1 | 2/2010 | Shah et al. |
| 2010/0187529 A1 | 7/2010 | Im |
| 2011/0248278 A1 | 10/2011 | Im et al. |
| 2011/0309370 A1 | 12/2011 | Im |

FOREIGN PATENT DOCUMENTS

| | | |
|---|---|---|
| DE | 10103670 | 8/2002 |
| EP | 655774 A2 | 5/1995 |
| EP | 681316 A2 | 11/1995 |
| EP | 1067593 A2 | 1/2001 |
| GB | 2338342 A | 12/1999 |
| GB | 2338343 A | 12/1999 |
| GB | 2338597 A | 12/1999 |
| JP | S57-027035 | 2/1982 |
| JP | 62160781 | 7/1987 |
| JP | 62181419 A | 8/1987 |
| JP | 62216320 | 9/1987 |
| JP | H01-256114 | 10/1989 |
| JP | 2081422 | 3/1990 |
| JP | 2283036 A | 11/1990 |
| JP | 04033327 A | 2/1992 |
| JP | 04-279064 | 10/1992 |
| JP | 5041519 | 2/1993 |
| JP | 5048190 | 2/1993 |
| JP | 06-011729 | 1/1994 |
| JP | 6252048 A | 9/1994 |
| JP | H06-260502 | 9/1994 |
| JP | 6283422 A | 10/1994 |
| JP | 7176757 A | 7/1995 |
| JP | H08-078330 | 3/1996 |
| JP | H09-007968 | 1/1997 |
| JP | 9171971 A | 6/1997 |
| JP | H09-270393 | 9/1997 |

| | | |
|---|---|---|
| JP | 9260681 A | 10/1997 |
| JP | 9321210 A | 12/1997 |
| JP | 10189998 | 7/1998 |
| JP | H10-244390 | 9/1998 |
| JP | 11025064 A | 1/1999 |
| JP | 11064883 A | 3/1999 |
| JP | 11-281997 | 10/1999 |
| JP | H11-297852 | 10/1999 |
| JP | 11330000 A | 11/1999 |
| JP | 2000-315652 | 11/2000 |
| JP | 2000346618 | 12/2000 |
| JP | 2001023920 A | 1/2001 |
| JP | 2002-203809 | 7/2002 |
| JP | 2000223425 | 8/2002 |
| JP | 2002-353142 | 12/2002 |
| JP | 2002353159 A | 12/2002 |
| JP | 2003-031496 | 1/2003 |
| JP | 2004031809 | 1/2003 |
| JP | 20003100653 | 4/2003 |
| JP | 2004-311935 | 11/2004 |
| TW | 457553 B | 10/2001 |
| TW | 464960 A1 | 11/2001 |
| TW | 564465 A | 12/2003 |
| TW | 569350 B | 1/2004 |
| WO | WO-97/45827 | 12/1997 |
| WO | WO-98/24118 | 6/1998 |
| WO | WO-99/31719 | 6/1999 |
| WO | WO-00/14784 | 3/2000 |
| WO | WO-01/18854 | 3/2001 |
| WO | WO-01/18855 | 3/2001 |
| WO | WO-01/71786 | 9/2001 |
| WO | WO-01/71791 | 9/2001 |
| WO | WO-01/73769 A1 | 10/2001 |
| WO | WO-02/31869 | 4/2002 |
| WO | WO-0231869 A2 | 4/2002 |
| WO | WO-02/42847 | 5/2002 |
| WO | WO-02/086955 | 10/2002 |
| WO | WO-02086954 A1 | 10/2002 |
| WO | WO-03/018882 | 3/2003 |
| WO | WO-03/046965 | 6/2003 |
| WO | WO-03/084688 | 10/2003 |
| WO | WO-2004/017380 | 2/2004 |
| WO | WO-2004017379 A2 | 2/2004 |
| WO | WO-2004017380 A2 | 2/2004 |
| WO | WO-2004017381 | 2/2004 |
| WO | WO-2004017382 A2 | 2/2004 |
| WO | WO-2004075263 A2 | 9/2004 |
| WO | WO-2005/029551 | 3/2005 |
| WO | WO-2005029546 A2 | 3/2005 |
| WO | WO-2005029548 A2 | 3/2005 |
| WO | WO-2005029550 A2 | 3/2005 |
| WO | WO-2005/054949 A2 | 6/2005 |
| WO | WO-2006/055003 A1 | 5/2006 |

OTHER PUBLICATIONS

Biegelsen, D.K., L.E. Fennell and J.C. Zesch, Origin of oriented crystal growth of radiantly melted silicon on SiO/sub 2, Appl. Phys. Lett. 45, 546 (1984).

Boyd, I. W., "Laser Processing of Thin Films and Microstructures, Oxidation, Deposition and Etching of Insulators," (Springer—Verlag Berlin Heidelber, 1987.

Broadbent et al., "Excimer Laser Processing of Al-1%Cu/TiW Interconnect Layers," Proceedings, Sixth International IEEE VLSI Multilevel Interconnection Conference, Santa Clara, CA, Jun. 12-13, pp. 336-345 (1989).

Brotherton et al., "Influence of Melt Depth in Laser Crystallized Poly-Si Thin Film Transistors," Journal of Appl. Phys., 82:4086 (1997).

Brotherton, "Polycrystalline Silicon Thin Film Transistors," Semicond. Sci. Tech., 10:721-738 (1995).

Brotherton, S.D., et al., Characterisation of poly-Si TFTs in Directionally Solidified SLS Si, Asia Display/IDW'01, p. 387-390.

Crowder et al., "Low-Temperature Single-Crystal Si TFT's Fabricated on Si Films Processed via Sequential Lateral Solidification," IEEE Electron Device Letter, 19 (8): 306 (1998).

Crowder et al., "Parametric Investigation of SLS-processed Poly-silicon Thin Films for TFT Applications," Preparations and Characterization, Elsevier, Sequoia, NL, vol. 427, No. 1-2, Mar. 3, 2003, pp. 101-107, XP004417451.

Crowder et al., "Sequential Lateral Solidification of PECVD and Sputter Deposited a-Si Films", Mat. Res. Soc. Symp. Proc. 621:Q.9.7.1-9.7.6, 2000.

Dassow, R. et al. Laser-Crystallized Polycrystalline Silicon on Glass for Photovoltaic Applications, Solid State Phenomena, pp. 193-198, vols. 67-68, Scitec Publications, Switzerland.

Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.

Dassow, R. et al., Laser crystallization of silicon for high-performance thin-film transistors, Semicond. Sci. Technol., 2000, pp. L31-L34, vol. 15, UK.

Dimitriadis, C.A., J. Stoemenos, P.A. Coxon, S. Friligkos, J. Antonopoulos and N. A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).

Endert et al., "Excimer Laser: A New Tool for Precision Micromachining," Optical and Quantum Electronics, 27:1319 (1995).

Fogarassy et al., "Pulsed Laser Crystallization of Hydrogen-Free a-Si Thin Films for High-Mobility Poly-Si TFT Fabrication," Applied Physics A—Solids and Surfaces, 56:365-373 (1993).

Geis et al., "Crystallographic orientation of silicon on an amorphous substrate using an artificial surface-relief grating and laser crystallization," Appl. Phys. Lett. 35(1) Jul. 1, 1979, 71-74.

Geis et al., "Silicon graphoepitaxy using a strip-heater oven," Appl. Phys. Lett. 37(5), Sep. 1, 1980, 454-456.

Geis et al., "Zone-Melting recrystallization of Sl Films with a moveable-strip heater oven," J. Electro-Chem. Soc., 129: 2812 (1982).

Gosain et al., "Formation of (100)-Textured Si Film Using an Excimer Laser on a Glass Substrate," Jpn. J. Appl. Phys., vol. 42 (2003) pp. L135-L137.

Gupta et al., "Numerical Analysis of Excimer-laser induced melting and solidification of Si Thin Films", Applied Phys. Lett., 71:99, 1997.

Hau-Riege et al., "The Effects Microstructural Transitions at Width Transitions on interconnect reliability," Journal of Applied Physics, 87(12): 8467-8472.

Hawkins, W.G. et al., "Origin of lamellae in radiatively melted silicon flims," Appl. Phys. Lett. 42(4), Feb. 15, 1983.

Hayzelden, C. and J.L. Batstone, Silicide formation and silicide-mediated crystallization of nickel-implanted amorphous silicon thin films, J. Appl. Phys. 73, 8279 (1993).

Im et al., "Controlled Super-Lateral Growth of Si Films for Microstructural Manipulation and Optimization," Phys. Stat. Sol. (a), 166:603 (1998).

Im et al., "Crystalline Si Films for Integrated Active-Matrix Liquid-Crystals Displays," MRS Bulletin, 21:39 (1996).

Im et al., "On the Super Lateral Growth Phenomenon Observed in Excimer Laser-Induced Crystallization of Thin Si Films," Appl. Phys. Lett., 64 (17): 2303 (1994).

Im et al., "Phase Transformation Mechanisms Involved in Excimer Laser Crystallization of Amorphous Silicon Films," Appl. Phys. Lett., 63 (14): 1969 (1993).

Im et al., "Single-Crystal Si Films for Thin-Film Transistor Devices," Appl. Phys. Lett., 70(25): 3434 (1997).

Im, J.S., Method and system for producing crystalline thin films with a uniform crystalline orientation, U.S. Appl. No. 60/503,419; ref. file # 36013(BB); Columbia ref. M02-063.

Ishida et al., "Ultra-shallow boxlike profiles fabricated by pulsed ultraviolet-laser doping process," J. Vac. Sci. Technol. B 12(1): 399-403, (1994).

Ishihara et al., "A Novel Double-Pulse Excimer-Laser Crystallization Method of Silicon Thin-Films," Publication Office, Japanese Journal of Applied Physics, Tokyo, Japan, 34(8A): 3976-3981 (1995).

Jeon et al., "Two-step laser recrystallization of poly-Si for effective control of grain boundaries," Journal of Non Crystalline Solids, 266-269: 645-649 (2000).

Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.

Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.

Kahlert, H., "Creating Crystals," OE Magazine, Nov. 2001, 33-35.

Kim et al., "Grain Boundary Location-Controlled Poly-Si Films for TFT Devices Obtained Via Novel Excimer Laser Process," Mat. Res. Soc. Symp. Proc., vol. 358, 1995.

Kim et al., "Multiple Pulse Irradiation Effects in Excimer Laser-Induced Crystallization of Amorphous Si Films," Mat. Res. Soc. Sym. Proc., 321:665-670 (1994).

Kim, "Excimer-Laser-Induced Crystallization of Amorphous Silicon Thin Films," Ph. D. Dissertation Abstract, Columbia University, 1996.

Kim, C. et al., "Development of SLS-Based SOG Display," IDMC 2005, pp. 252-255.

Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.

Kim, H.-J., et al., "The effects of dopants on surface-energy-driven secondary grain growth in silicon films," J. Appl. Phys. 67 (2), Jan. 15, 1990.

Kim, H.J. et al., "New Excimer-laser-crystallization method for producing large-grained and grain boundary-location-controlled Si Films for Thin Film Transistors", Applied Phys. Lett., 68: 1513.

Kimura, M. and K. Egami, Influence of as-deposited film structure on (100) texture in laser-recrystallized silicon on fused quartz, Appl. Phys. Lett. 44, 420 (1984).

Knowles, D.S. et al., "P-59: Thin Beam Crystallization Method: a New Laser Annealing Tool with Lower Cost and Higher Yield for LTPS Panels," SID 00 Digest, pp. 1-3.

Kohler, J.R. et al., Large-grained polycrystalline silicon on glass by copper vapor laser annealing. Thin Solid Films, 1999, pp. 129-132, vol. 337, Elsevier.

Kung, K.T.Y. and R. Reif, Implant-dose dependence of grain size and (110) texture enhancements in polycrystalline Si films by seed selection through ion channeling, J. Appl. Phys. 59, 2422 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).

Lee, S.-W. and S.-K. Joo, Low temperature poly-Si thin-film transistor fabrication by metal-induced lateral crystallization, IEEE Electron Device Letters 17, 160 (1996).

Lee, S.-W., Y.-C. Jeon and S.-K. Joo, Pd induced lateral crystallization of amorphous Si thin films, Appl. Phys. Lett. 66, 1671 (1995).

Leonard, J.P. et al, "Stochastic modeling of solid nucleation in supercooled liquids", Appl. Phys. Lett. 78:22, May 28, 2001, 3454-3456.

Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.

Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.

Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on Insulator Devices, Eds. P.L.F. Hemment, Kluwer Academic Publishers 2000, pp. 55-61.

Mariucci et al., "Grain boundary location control by patterned metal film in excimer laser crystallized polysilicon," Proceedings of the Fifth International Conference on Polycrystalline Semiconductors, Schwabisch Gmund, Germany, 67-68: 175-180 (1998).

McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics, New York, US, 43(10): 946-948 (1983).

MICRO/LAS Lasersystem GMBH, "Overview of Beam Delivery Systems for Excimer Lasers," (1999).

MICRO/LAS Lasersystem GMBH, "UV Optics Systems for Excimer Laser Based Micromachining and Marking," (1999).

Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002).

Miyata et al, "Low-Temperature Polycrystalline Silicon Thin-Film Transistors for Large-Area Liquid Crystal Display," Japanese J. of Applied Physics, Part 1—Regular Papers Short Notes & Review Papers, 31:4559-62 (1992).

Nebel, "Laser Interference Structuring of A-Sl:h" Amorphous Silicon Technology—1996, San Francisco, CA Apr. 8-12, Materials Research Society Symposium Proceedings, vol. 420, Pittsburgh, PA (1996).

Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).

Noguchi, "Appearance of Single-Crystalline Properties in Fine-Patterned Si Thin Film Transistors (TFTs) by Solid Phase Crystallization (SPC)," Jpn. J. Appl. Phys., 32:L1584-L1587 (1993).

Ozawa et al., "Two-Dimensionally Position-Controlled Excimer-Laser-Crystallization of Silicon Thin Films on Glassy Substrate," Jpn. J. Appl. Phys. 38(10):5700-5705 (1999).

Sato et al., "Mobility anisotropy of electrons in inversion layers on oxidized silicon surfaces," Physical Review B (State) 4, 1950 (1971).

Smith, H.I. et al, "The Mechanism of Orientation in Si Graphoepitaxy by Laser Strip Heater Recrystallization," J. Electrochem. Soc.: Solid-State Science and Technology, vol. 130, No. 10, Oct. 1983, pp. 2050-2053.

Song et al., "Single Crystal Si Islands on SiO2 Obtained Via Excimer Laser Irradiation of a Patterned Si Film", Applied Phys. Lett., 68:3165, 1996.

Sposili et al., "Line-scan sequential lateral solidification of Si thin films", Appl. Phys. A67, 273-6, 1998.

Sposili et al., "Sequential Lateral Solidification of Thin Silicon Films on SiO2," Appl. Phys. Lett., 69(19): 2864 (1996).

Sposili et al., "Single-Crystal Si Films via a Low-Substrate-Temperature Excimer-Laser Crystallization Method," Mat. Res. Soc. Symp. Proc., 452: 953-958 (1997).

Thompson, C.V. and H.I. Smith, Surface-energy-driven secondary grain growth in ultrathin (<100 nm) films of silicon, Appl. Phys. Lett. 44, 603 (1984).

van der Wilt, P.C. et al., "State-of-the-Art Laser Crystallization of Si for Flat Panel Displays," PhAST, May 18, 2004, pp. 1-34.

van der Wilt, P.C. et al., "The Commercialization of the SLS Technology," Taiwan FPD, Jun. 11, 2004, pp. 1-12.

van der Wilt, P.C., "Textured poly-Si films for hybrid SLS," Jul. 2004, pp. 1-5.

Voutsas, A.T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T. et al.: "Effect of process parameters on the structural characteristics of lateralyy grown, laser-annealed polycrystalline silicon films," Journal of applicaed Physics, vol. 94, No. 12, Dec. 15, 2003.

Voutsas, A.T., A new era of crystallization: advances in polysilicon crystallization and crystal engineering, Applied Surface Science 250-262, 2003.

Watanabe et al., "Crystallization Process of Polycrystalline Silicon by KrF Excimer Laser Annealing," Japanese J. of Applied Physics, Part 1—Regular Papers Short Notes & Review Papers, 33:4491-98 (1994).

Weiner, K. H. et al. "Laser-assisted, Self-aligned Silicide Formation," A Verdant Technologies technical brief, Aug. 7, 1997, 1-9.

Weiner, K. H. et al., "Ultrashallow Junction Formation Using Projection Gas Immersion Laser Doping (PGILD)," A Verdant Technologies Technical Brief, Aug. 20, 1997.

Werner, J.H., et al. From polycrystalline to single crystalline silicon on glass, Thin Solid Films 383, 95-100, 2001.

White et al., "Characterization of thin-oxide MNOS memory transistors," IEEE Trans. Electron Devices ED-19, 1280 (1972).

Yamamuchi et al., "Polycrystalline silicon thin films processed with silicon ion implantation and subsequent solid-phase crystallization: Theory, experiments, and thin-film transistor applications," Journal of Applied Physics, 75(7):3235-3257 (1994).

Yoshimoto et al., "Excimer-Laser-Produced and Two-Dimensionally Position-Controlled Giant Si Grains on Organic SOG Underlayer," p. 285-286, AM-LCD (2000).

Jeon et al., "New Excimer Laser Recrystalization of Poly-Si for Effective Grain Growth and Grain Boundary Arrangement," Jpn. J. Appl. Phys. vol. 39 (2000) pp. 2012-2014, Part 1, No. 4B, Apr. 2000.

International Search Report and Written Opinion issued for corresponding International Patent Application No. PCT/US08/77704.

Jeon et al., "New Excimer Laser Recrystallization of Poly-Si for Effective Grain Growth and Grain Boundary Arrangement," Jpn. J. Appl. Phys. vol. 39 (2000) pp. 2012-2014, Part 1, No. 4B, Apr. 2000.

Sinke et al., "Explosive crystallization of amorphous silicon: Triggering and propagation," Applied Surface Science, vol. 43, pp. 128-135 (1989).

Andrä et al., "A new technology for crystalline silicon thin film solar cells on glass based on the laser crystallization," IEEE, pp. 217-220 (2000).

Andrä et al., "Multicrystalline LLC-Sl thin film solar cells on low temperature glass," Poster, 3rd world Conference on Photovoltaic Energy Conversion, Osaka, Japan, pp. 1174-1177, May 11-18, 2003.

* cited by examiner

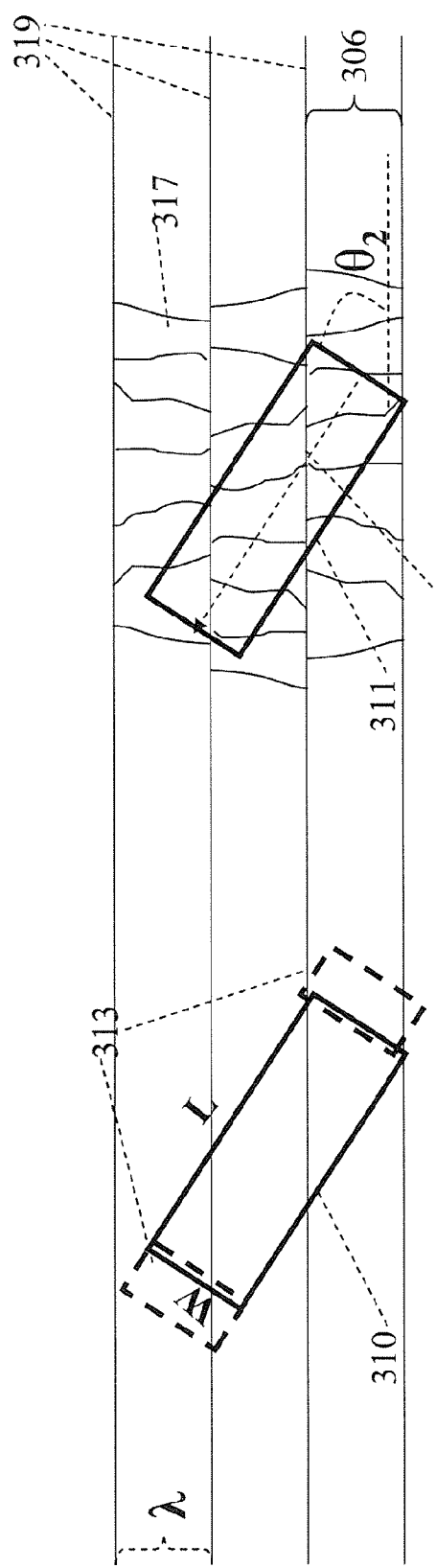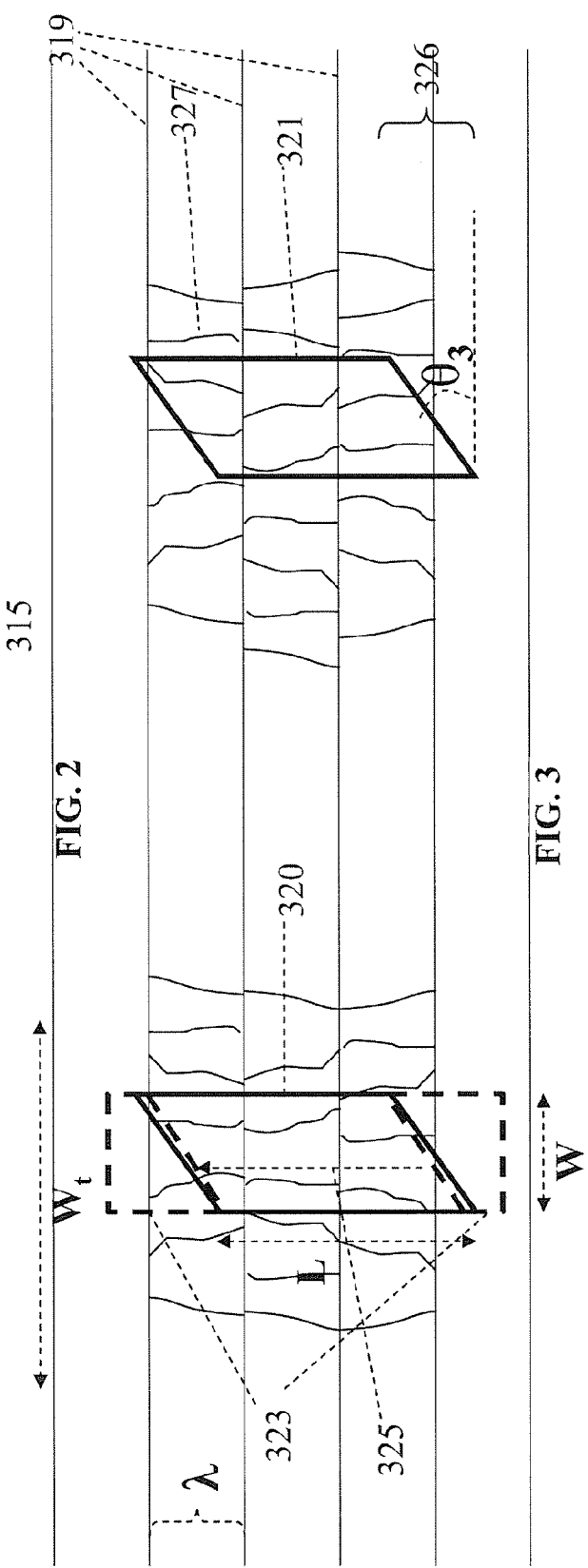
FIG. 2
FIG. 3

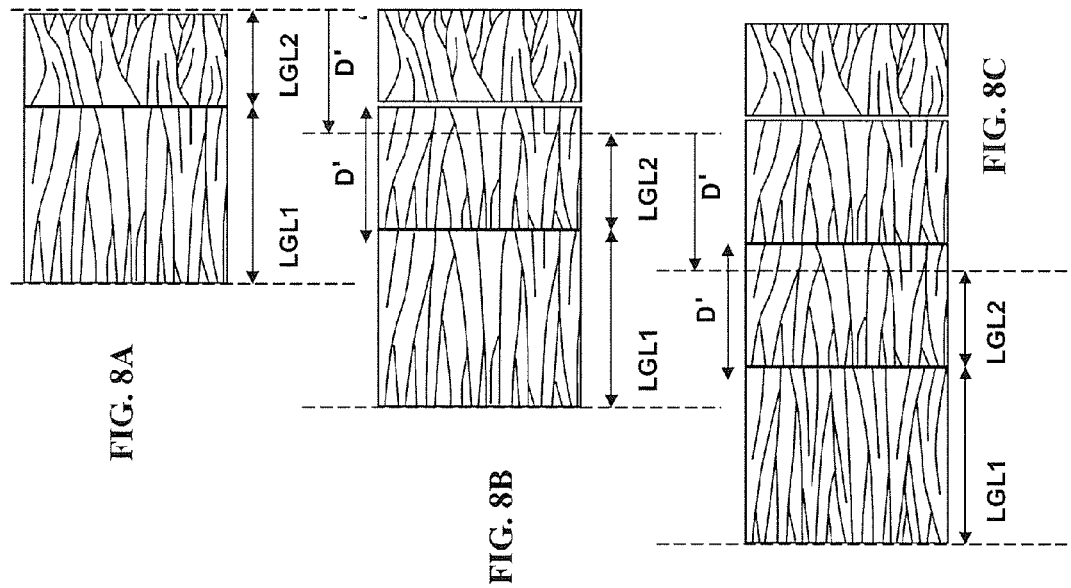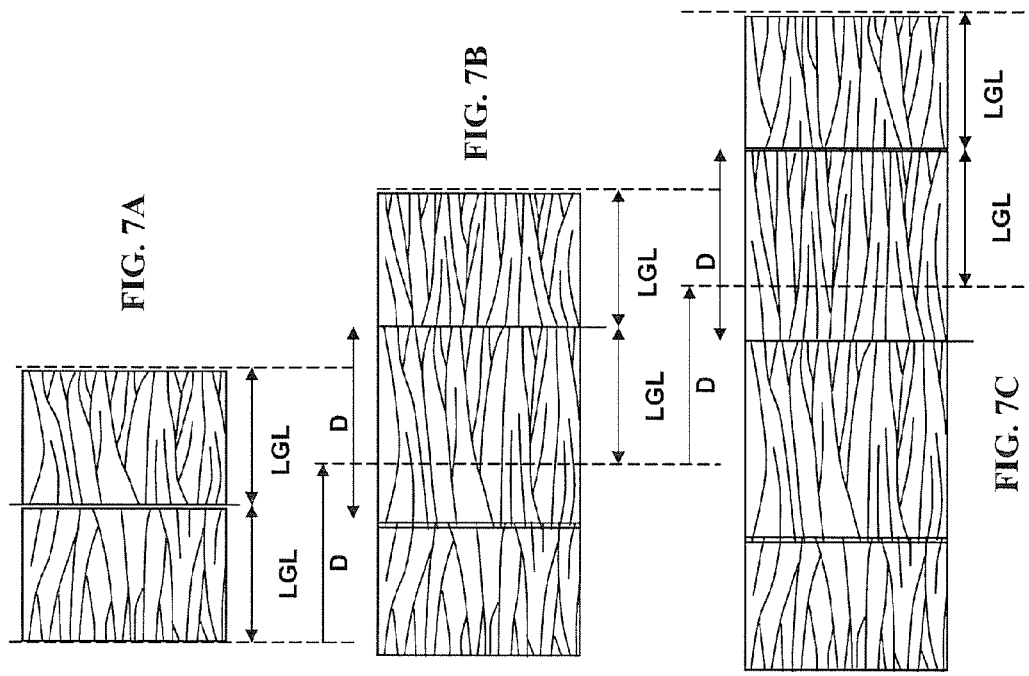

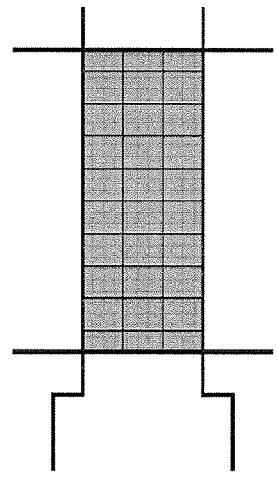
FIG. 10B Uniform
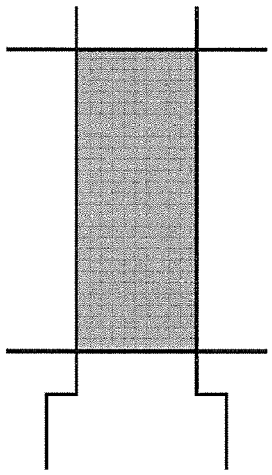
FIG. 10D Single-crystal islands
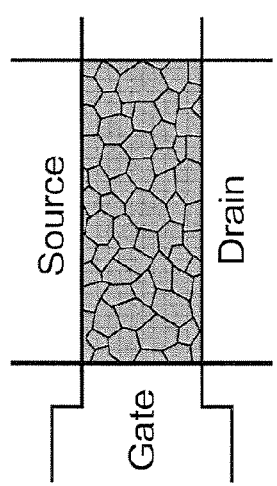
FIG. 10A Random
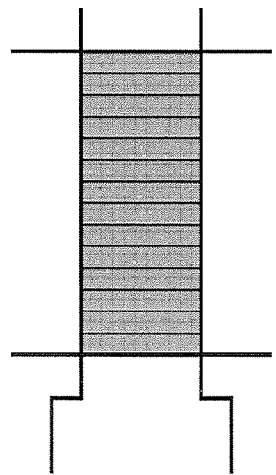
FIG. 10C Directional

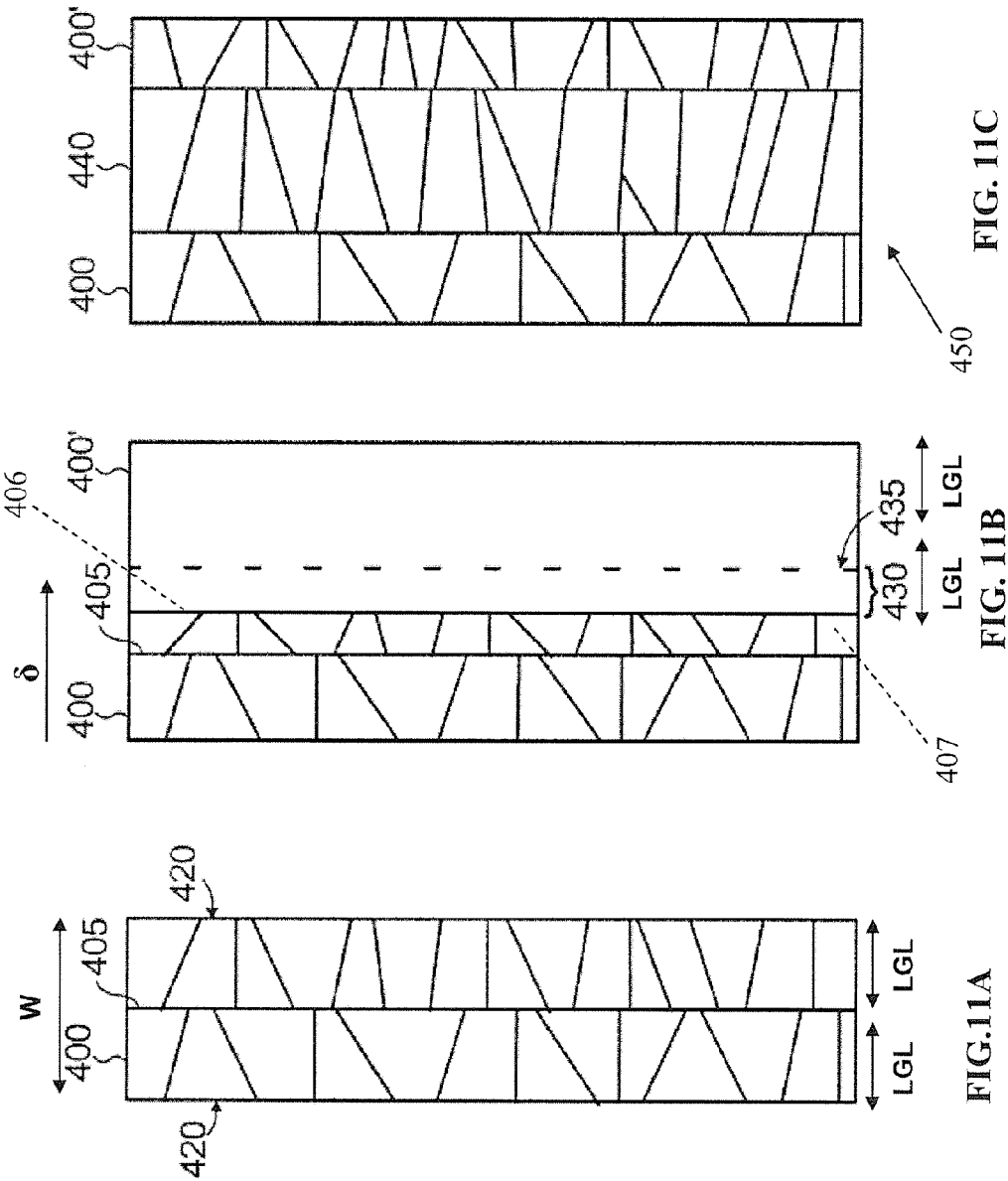

METHODS OF PRODUCING HIGH UNIFORMITY IN THIN FILM TRANSISTOR DEVICES FABRICATED ON LATERALLY CRYSTALLIZED THIN FILMS

This application is a U.S. National Phase application under 35 U.S.C. §371 of International Patent Application No. PCT/US2008/077704 filed Sep. 25, 2008, which claims the benefit under 35 U.S.C. 119(e) of U.S. Provisional Patent Application No. 60/995,199 filed Sep. 25, 2007, each of which is hereby incorporated by reference in its entirety.

FIELD

The disclosed subject matter relates generally to laser crystallization of thin films and specifically to methods of increasing uniformity of performance among thin film transistors formed on crystallized thin films.

BACKGROUND

In recent years, various techniques have been investigated for crystallizing or improving the crystallinity of an amorphous or polycrystalline semiconductor film. Such crystallized thin films can be used in the manufacturing of a variety of devices, such as image sensors and active-matrix liquid-crystal display ("AMLCD") devices. In the latter, a regular array of thin-film transistors ("TFTs") is fabricated on an appropriate transparent substrate, and each transistor serves as a pixel controller.

Crystalline semiconductor films, such as silicon films, have been processed to provide pixels for liquid crystal displays using various laser processes including excimer laser annealing ("ELA") and sequential lateral solidification ("SLS") processes. SLS is well suited to process thin films for use in AMLCD devices, as well as organic light emitting diode ("OLED") and active-matrix OLED (AMOLED) devices.

In ELA, a region of the film is irradiated by an excimer laser to partially melt the film, which subsequently crystallizes. The process typically uses a long, narrow beam shape that is continuously advanced over the substrate surface, so that the beam can potentially irradiate the entire semiconductor thin film in a single scan across the surface. The Si film is irradiated multiple times to create the random polycrystalline film with a uniform grain size. Although ELA produces small-grained polycrystalline films; however, the method often suffers from microstructural non-uniformities, which can be caused by pulse to pulse energy density fluctuations and/or non-uniform beam intensity profiles. FIG. 10A illustrates a random microstructure that can be obtained with ELA. This figure, as well as all other figures, are not drawn to scale, and are intended to be illustrative in nature. FIG. 10E, is a top view SEM image of a film process via ELA and shows the random microstructure of the film, containing randomly located grain boundaries 1002.

SUMMARY

The application describes methods of and systems for producing high uniformity in thin film transistor devices fabricated on laterally crystallized thin films.

According to one aspect of the application, a thin film transistor (TFT) includes a channel area disposed in a crystalline substrate, said crystalline substrate comprising a plurality of grain boundaries that are approximately parallel with each other and are spaced apart with approximately equal spacings, $\lambda$. The shape of the channel area comprises a non-equiangular polygon, the polygon having two opposing side edges that are oriented substantially perpendicular to the plurality of grain boundaries and an upper edge and a lower edge. At least a portion of each of the upper and lower edges is oriented at a tilt angle with respect to the plurality of grain boundaries that is greater than 0 and less than or equal to 90 degrees. The tilt angles for the portion of each edge of the upper and lower edges selected such that the number of grain boundaries covered by the polygon is independent of the location of the channel area within the crystalline substrate.

According to another aspect of the application, the polygon comprises a concave polygon.

According to another aspect of the application, the polygon comprises a convex polygon.

According to another aspect of the application, the tilt angles for the portion of each edge of the upper and lower edges are the same.

According to another aspect of the application, the tilt angles for the portion of each edge of the upper and lower edges are different.

According to another aspect of the application, the polygon comprises a parallelogram.

According to another aspect of the application, the upper and lower edges of the parallelogram are substantially parallel with each other, and wherein the tilt angles for the upper and lower edges of the parallelogram are selected such that the vertical span for each of the upper and lower edges is about an integer multiple of the spacing between the grain boundaries.

According to another aspect of the application, in the parallelogram, the tilt angle $\theta$ for the upper and lower edges, the approximately equal spacing $\lambda$ among the grain boundaries, and the distance W between the two side edges, satisfy the equation, $W*\tan(\theta)=m\lambda$, with the value of m about an integer.

According to another aspect of the application, for the parallelogram, m is about 1.

According to another aspect of the application, for the parallelogram, m about an integer greater than 1.

According to another aspect of the application, the polygon comprises a quadrilateral.

According to another aspect of the application, the upper and lower edges of the quadrilateral are not parallel with each other, and the tilt angles for the upper and lower edges of the parallelogram are selected to be different, such that the vertical spans for the upper and lower edges are about different integer multiples of the spacing between the grain boundaries According to another aspect of the application, the tilt angle $\theta$ for the upper edge or the lower edge of the quadrilateral, the approximately equal spacing $\lambda$ among the grain boundaries, and the distance W between the two side edges, satisfy the equation, $W*\tan(\theta)=m\lambda$, with the value of m about an integer.

According to another aspect of the application, the TFT also includes a source area and a drain area each adjacent to one of the upper and lower edges.

According to another aspect of the application, at least one of the upper and lower edges comprises a plurality of line segments, and one or more of the line segments has a tilt angle with respect to the plurality of grain boundaries that is greater than 0 and less than or equal to 90 degrees. The tilt angles for each of the one or more line segments is selected such that the number of grain boundaries covered by the polygon is independent of the location of the channel area within the crystalline substrate.

According to yet another aspect of the application, the tilt angle for each of the one or more line segments is selected such that the vertical span for that line segment is about an integer multiple of the spacing between the grain boundaries.

According to another aspect of the application, one of the upper and lower edges includes n line segments each having the same tilt angle θ, and connects an end of a first side edge to an end of a second side edge. Further, for a distance W between the two side edges, the tilt angle θ satisfies the equation $W*\tan(\theta)/n=m\lambda$, with the value of m close to an integer.

According to yet another aspect of the application, a system for processing a film includes a laser source providing a sequence of laser beam pulses, laser optics that shape each laser beam pulse into a set of shaped beamlets, each of the beamlets having a length defining the y-direction, a width defining the x-direction, and a fluence that is sufficient to substantially melt a film throughout its thickness in an irradiated region and further being spaced in the x-direction from adjacent beamlets by gaps; and a stage for supporting the film and capable of translation in at least the x-direction, wherein the ratio of the length and the width is approximately one.

According to yet another aspect of the application, a method of preparing a polycrystalline film includes providing a substrate having a thin film disposed thereon, said film capable of laser-induced melting; generating a laser beam for irradiating the film, wherein the laser beam is a line beam which causes the irradiated portion of the film to melt throughout its thickness, and wherein the irradiated portion of the film has a long axis and a short axis, and further wherein the laser beam has an intensity profile that is asymmetric such that the intensity of the laser beam changes from a first end of the short axis to a second end of the short axis; melting a first portion of the film by irradiating the first portion with the laser beam; permitting the first portion to laterally solidify, wherein the solidified first portion includes a first column and a second column of laterally grown crystal grains, the first column formed parallel to the long axis on a first side of the first portion covering the first end of the short axis, and the second column formed parallel to the long axis on a second side of the first portion covering the second end of the short axis, and wherein when measured in the direction of the short axis a first average length of crystal grains in the first column is larger than a second average length of crystal grains in the second column; and melting a second portion of the film by irradiating the second portion with the laser beam, wherein the second portion is laterally displaced by a displacement with respect to the first portion, wherein the displacement is parallel to the short axis and in the direction going from the second end to the first end of the short axis, and further wherein the value of the displacement is larger than the second average length and smaller than the sum of the first and the second average lengths.

According to another aspect of the application, the intensity profile of the laser beam is a linear profile which changes linearly from the first end of the short axis to the second end of the short axis, and remains almost constant along the long axis.

According to another aspect of the application, a method of using a plurality of thin film transistors (TFTs) disposed in a crystalline substrate, said crystalline substrate including a plurality of grain boundaries that are approximately parallel with each other and are spaced apart with approximately equal spacings, is provided. The method comprises causing a channel current to flow through each TFT of the plurality of TFTs, such that the number of grain boundaries intersected by the channel current of each TFT of the plurality of TFTs is approximately the same.

According to another aspect of the application, a method of manufacturing a plurality of thin film transistors (TFTs) on a crystalline substrate, wherein the plurality of TFTs are disposed in a crystalline substrate, said crystalline substrate having a plurality of grain boundaries that are approximately parallel with each other and are spaced apart with approximately equal spacings, λ, is provided. The method includes forming a channel region of each TFT of the plurality of TFTs in a shape which comprises a non-equiangular polygon, the polygon having two opposing side edges that are oriented substantially perpendicular to the plurality of grain boundaries and an upper edge and a lower edge, wherein at least a portion of each of the upper and lower edges is oriented at a tilt angle with respect to the plurality of grain boundaries that is greater than 0 and less than or equal to 90 degrees, the tilt angles for the portion of each edge of the upper and lower edges selected such that the number of grain boundaries covered by the polygon is independent of the location of the channel area within the crystalline substrate.

BRIEF DESCRIPTION OF THE DRAWINGS

In the Drawing:

FIG. 2 is a schematic illustration of tilted small width TFTs on a crystallized film with periodic grain boundaries;

FIG. 3 is a schematic illustration of shape engineered TFTs on a crystallized film with periodic grain boundaries, according to some embodiments;

FIGS. 7A-7C, depict a schematic representation a 2 shot SLS technique;

FIGS. 8A-8C, depict a schematic representation of an embodiment using an asymmetric beam profile in a 2 shot SLS technique;

FIG. 10A is a schematic illustration of a TFT formed within a film having a crystalline microstructure formed by excimer laser annealing;

FIGS. 10B-10D illustrate TFTs formed within films having crystalline microstructures formed by sequential lateral solidification;

FIGS. 11A-11D illustrate the generation of "uniform" crystals using sequential lateral solidification.

DETAILED DESCRIPTION

The issued US patents, allowed applications, published foreign applications, and references, that are cited herein are hereby incorporated by reference to the same extent as if each was specifically and individually indicated to be incorporated by reference.

SLS is a pulsed-laser crystallization process that can produce high-quality polycrystalline films having large and uniform grains. For SLS, the film can be installed on a substrate, including a substrate made of a material, e.g., plastic or glass, which may be intolerant to heat. Exemplary SLS processes and systems are described in commonly-owned U.S. Pat. Nos. 6,322,625, 6,368,945, 6,555,449, and 6,573,531, the entire contents of which are incorporated herein by reference.

Figure 10G:
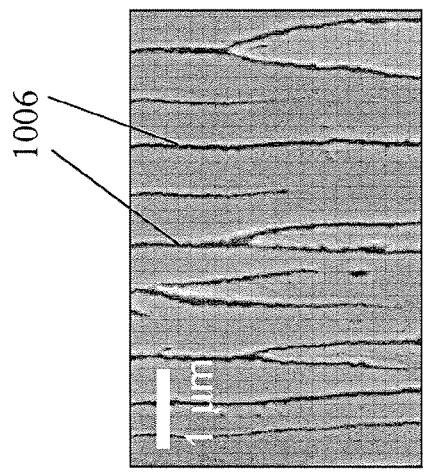
FIG. 10G is a top view SEM image of a film with a directional microstructure.
Figure 10F:
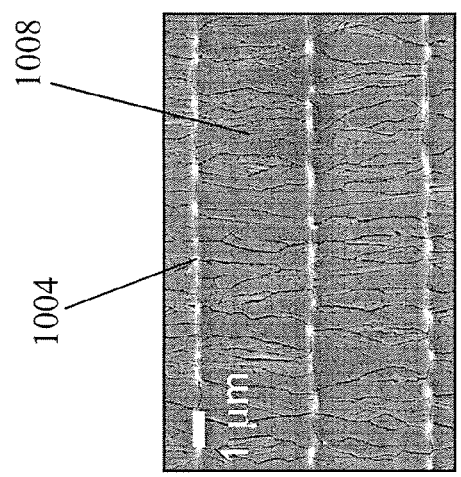
FIG. 10F is a top view SEM image of a film with a uniform microstructure.
Figure 10E:
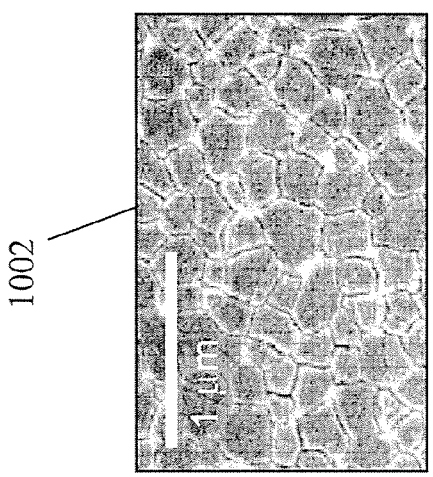
FIG. 10E, is a top view SEM image of a film process via ELA.

SLS uses controlled laser pulses to melt a region of an amorphous or polycrystalline thin film on a substrate. The melted region then crystallizes from the solid-melt interface into a laterally solidified columnar structure or a plurality of location-controlled large single-crystal regions. Generally, the melt/crystallization process is sequentially repeated over the surface of a large thin film, with a large number of laser pulses. The processed film on substrate is then used to produce one large display, or even divided to produce multiple displays. FIG. 10B is a schematic drawing of a TFT fabricated within a film having a "uniform" microstructure created with SLS methods, e.g., the "2 Shot" SLS method. FIG. 10F is a top view SEM image of a film with a uniform microstructure, showing the perpendicular grain boundaries 1004 and horizontal grain boundaries 1008. FIG. 10C is a schematic drawing of a TFT fabricated within a film having a "directional" microstructure created with SLS. FIG. 10G is a top view SEM image of a film with a directional microstructure, showing horizontal grain boundaries 1006. FIG. 10D is a schematic drawing of a TFT fabricated within a film having a single crystal structure created with SLS.

When a polycrystalline material is used to fabricate devices having TFTs, the total resistance to carrier transport within the TFT channel can be affected by the combination of high resistance barriers that a carrier has to cross as it travels under the influence of a given potential. Grain boundaries, i.e., the boundaries between crystallographic grains, can pose such high resistance barriers. Thus, in general, the performance of TFT devices fabricated on SLS-processed polycrystalline films depends on the microstructure of the film in the channel, as well as the orientation of channel with respect to grain boundaries.

One important factor when manufacturing devices, e.g., displays, that use TFTs, is to achieve uniform performance among different TFTs. Differences among performances of different TFTs in a device can result in a variance in the output of the device, e.g., a variance in the brightness of different pixels in a display. Such differences can be discernible at macroscopic levels and can affect the overall quality of the device. Furthermore, the differences are most noticeable when pixel brightness varies abruptly, that is, when adjacent pixels show a sharp difference in brightness. Gradual changes in brightness across a pixel display are not as obvious to the human eye. Thus it can be useful to achieve a more uniform, albeit intermediate, performance for all TFTs, rather than to achieve a high performance for some and a medium or low performance for other TFTs.

For a TFT formed on a crystallized film, its performance can be affected by the number of intersecting grain boundaries, which are the crystalline grain boundaries that intersect the direction of the channel current in the TFT. Thus a difference in performance among different TFTs can arise from a difference in the number and location of intersecting grain boundaries. In order to reduce this type of non-uniformity, one can reduce the variance in the number of grain boundaries among different TFTs.

In one or more embodiments, in accordance with one aspect of the invention, the number and location of grain boundaries and the location of TFTs with respect to these grain boundaries is controlled to provide a statistically similar number of intersecting grain boundaries among different TFTs. While intersecting grain boundaries can reduce the performance of the TFT, they exist because typical manufacturing processes generate such boundaries. It can therefore be useful to crystallize a film such that different TFTs can experience approximately the same number of such intersecting grain boundaries.

An irradiation protocol, referred to herein as "uniform" SLS, can be used to prepare a uniform crystalline film characterized by periodic columns of laterally elongated crystals and a set of periodic grain boundaries as depicted in FIGS. 10B, 10F. Uniform SLS involves exposing a film to a pulsed laser irradiation, which melts the irradiated region of the film. Upon removal of the irradiation from the melted region, the melted region crystallizes starting from the boundaries of the melted region with the solid region around it. The crystal thus formed grows for a distance LGL (Lateral Growth Length) before crystallization stops and the melted region completely solidifies. Maximum value of LGL depends on the characteristics of the film, e.g., thickness, film composition, and melt temperature. A maximum LGL is achieved when crystallization conditions are optimal for crystal growth. In some embodiments using the SLS method, the laser beam is selected as a line beam with a width such that the width of the melted region does not exceed twice the maximum value of LGL. In these embodiments, the effective LGL is approximately half of the width of the melted region. After each pulse, the laser beam is shifted with respect to the film by an amount δ. For uniform SLS, this shift is chosen to be between LGL and 2LGL (width of the melted region), i.e., LGL<δ<2 LGL. Uniform SLS method is described with reference to FIGS. 11A-11D.

Referring to FIG. 11A, a first laser pulse irradiates and melts the region 400 of the film. In some embodiments, the laser beam is a linear beam. As a result, the melted region 400 is in the shape of a rectangle. The width of the beam is selected such that the width of the melted region W is less than two times the maximum LGL. The length of the beam can be greater than 10 mm and up to or greater than 1000 mm. In the exemplary embodiments, the energy density of the beam is sufficient to completely melt the irradiated region, 400. After the irradiation is removed from region 400, the melted region cools down and crystallizes. In this case, grains grow laterally from an interface 420 between the unirradiated solid region and the melted region. The two melt fronts collide approximately at the centerline 405 before the temperature of the melt becomes sufficiently low to trigger nucleation. As a result, the region 400 is divided into two columns of crystalline grains, each with a with a width LGL, where the value of LGL is approximately half of W, the width of the originally melted region.

Referring to FIG. 11B, the location of the laser beam shifts with respect to the film by a predetermined displacement distance δ, which is selected greater than LGL and less than two LGL. A second region of the film, 400', is irradiated and melted by a second laser beam pulse. The displacement of the film, δ, is related to the desired width of overlap 430 of consecutive laser beam pulses. The overlap can be less than about 90% and more than about 10% of the LGL. The overlap, melts part of the crystal grains of the left hand column in 400 and leaves unmelted part of those grains, shown in column 407. The region 400', similar to the region 400 in FIG. 11A, crystallizes into two columns of crystal grains, each with a width LGL. For grains growing from the left hand side boundary 406, the unmelted crystal grains in column 407 constitute seeds for the crystal growth. These crystal grains grow further during this stage of crystallization to form region 440 in FIG. 11C.

FIG. 11C illustrates the crystallized region 450 of the film after the irradiation from the second pulse is removed and the region 400' completes crystallization. Region 450 includes a region 440 that results from growth of the crystal grains in column 407 of FIG. 11B. These crystal grains all have a length equal to δ which is larger than LGL. Thus, a column with width δ, consisting of elongated crystals, is formed by two laser beam irradiations on average. Irradiation continues across the film to create multiple columns of laterally extended crystals of width δ.

Figure 11D:
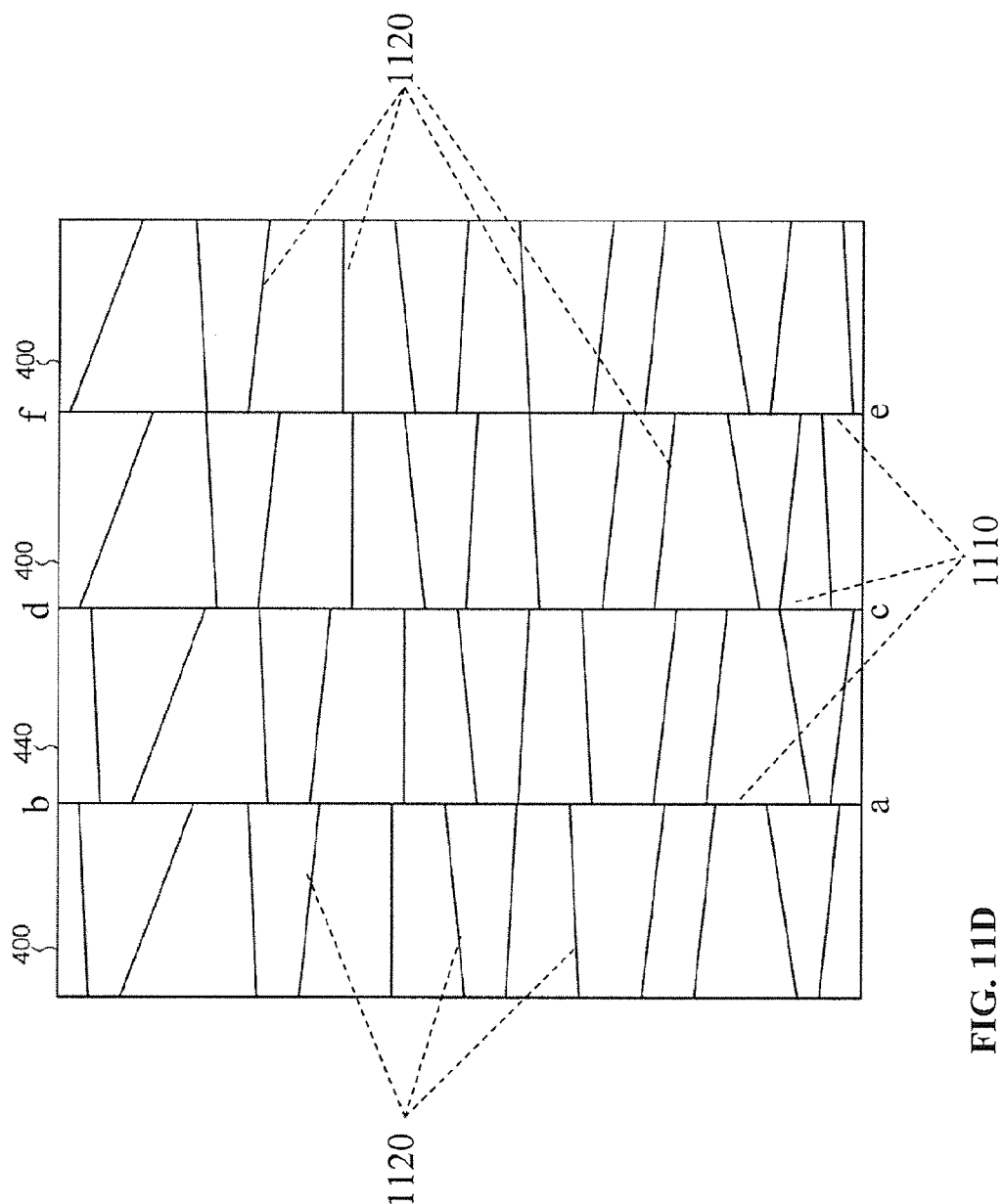

FIG. 11D illustrates the microstructure of the film after multiple irradiations and depicts several columns 440 of laterally extended crystals. The crystals that form within the melted regions preferably grow laterally and with a similar orientation, and meet each other at a boundary within the particular irradiated region of film. In such instances, the grains are not significantly elongated; however, they are of uniform size and orientation. Specifically two types of grain boundaries, called perpendicular and parallel grain boundaries, are observed in silicon films processed via uniform SLS, and are marked in FIG. 11D. Three perpendicular grain boundaries 1110, extend from points a to b, c to d, and e to f. Perpendicular grain boundaries are spaced almost regularly at a distances δ apart, and at approximately right angles with respect to the direction of laser scan. Other shown grain boundaries, some of which are marked as grain boundaries 1120, are parallel grain boundaries which, when extended, intersect perpendicular grain boundaries. The direction and spacing between parallel grain boundaries varies in general. For further details, see U.S. Pat. No. 6,573,531, the contents of which are incorporated herein in their entirety by reference.

Crystals formed via "uniform" SLS methods exhibit substantial uniformity in their grain structure, with the number and location of perpendicular grain boundaries substantially controlled. In order to achieve more uniformity in performance, TFTs have been oriented on these films such that the TFT channel direction (and thus the current flow) runs along the direction of the parallel grains 1120, and thus mostly the perpendicular grain boundaries 1110 and not the parallel grain boundaries 1120 intersect their channel currents.

Figure 9:
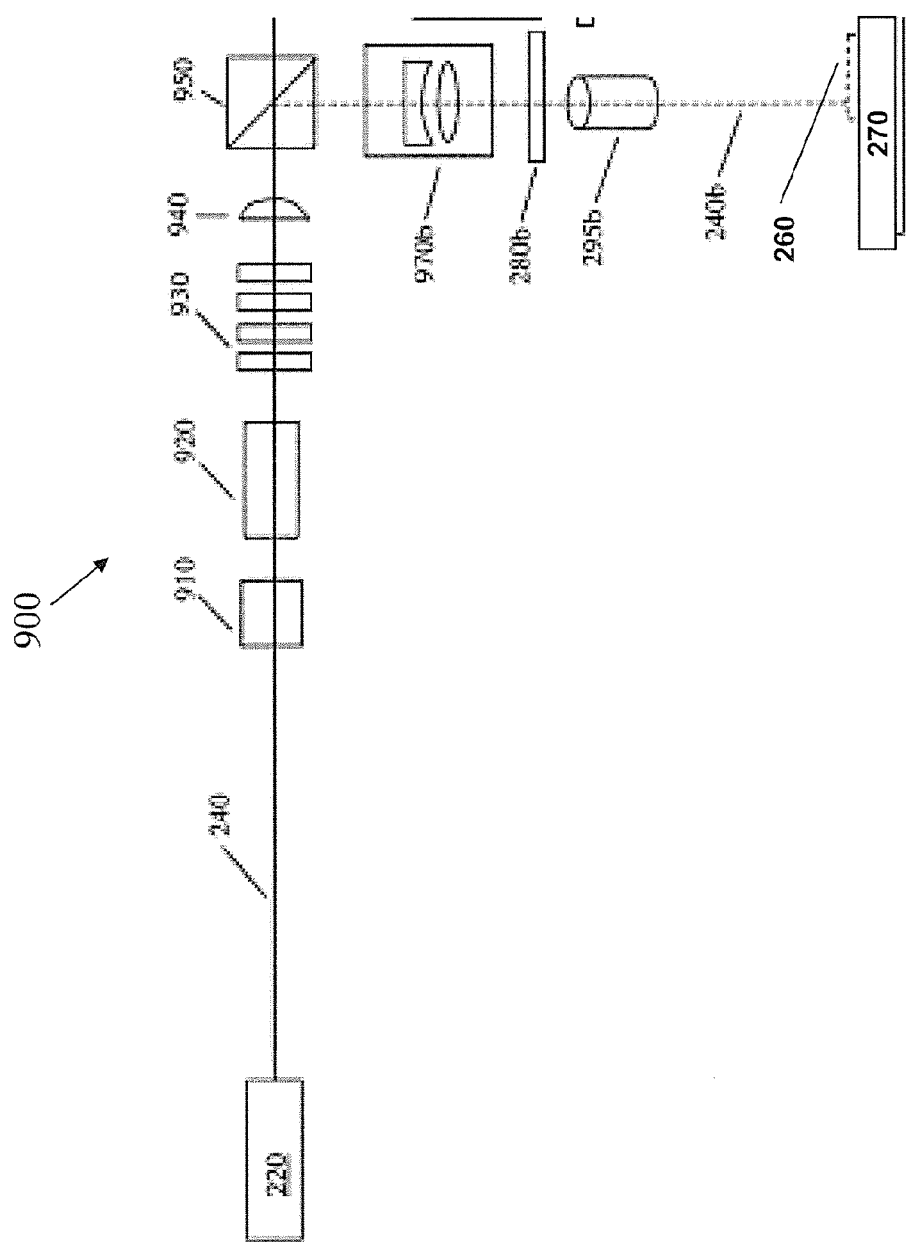
FIG. 9 shows a schematic of a system for generating a 2D laser beam.

In some SLS schemes, uniform SLS method is achieved using a "2D systems". In a 2D system, a region of a thin film is irradiated with laser pulses shaped in rectangular forms. FIG. 9 depicts an exemplary system 900 for generating a 2D laser beam. The system 900 includes a laser source 220, an attenuator 910, a telescope 920, a homogenizer 930, a condenser lens 940 and a beam reflecting element 950. The laser beam pulses 240 generated by the laser source 220 are directed to the beam reflecting element 950 via the attenuator 910, telescope 920, homogenizer 930 and condenser lens 940. At the beam reflecting element 950, the incoming laser beam pulses 240 are directed along the out-going beam paths, leading to the substrate 260 that is mounted on the wafer-handling stage 270. The optical path includes a variable-focus field lens 970b, a mask 280b and a projection lens 295b.

Other methods useful in providing uniformly crystallized films having grain boundaries at regular intervals can benefit from this invention. By way of example, a line scan SLS method such as described in co-pending US patent publication 2006-0254500 A1, entitled "Line Scan Sequential Lateral Solidification of Thin Films", filed Dec. 2, 2005, can be employed.

According to one aspect of the invention, a higher uniformity in performance of various TFTs can be achieved by appropriate selection of the shape or geometry of the TFT channel that is manufactured on the underlying crystallized film. Conventional TFTs are typically formed such that their channel region is shaped as a square or a rectangle. Moreover, TFTs are typically positioned at zero angles with respect to perpendicular grain boundaries (See, e.g., FIG. 1A). Such orientations cause maximum performance variations among TFTs, when they are placed randomly with respect to the film.

In one or more embodiments, TFTs channels are shape engineered, that is shaped as polygons having at least one set of parallel edges substantially perpendicular to the regularly located grain boundaries (e.g., perpendicular grain boundaries in a uniformly crystallized film) and substantially parallel to the direction of the current flow in the channel. The polygons further have a second set of edges that are tilted with respect to the intersecting grain boundaries. The shape and the tilt of the second set of edges is chosen such that the average number of intersecting grain boundaries remains approximately constant among different randomly placed TFTs. In some embodiments the TFTs are shaped as parallelograms, with the tilt angle of the edges selected based on the TFT width and the grain boundary periodicity. In general, the tilt angle for any line segment on the edge of a shape is defined as the smaller angle between that line segment and the direction of the periodic grain boundaries. According to other embodiments, the tilted set of edges are shaped as a non straight lines, containing multiple angled straight sub-edges (e.g., a zigzag shape), or edges that are in some irregular forms in order to further reduce the variability of intersecting grain boundaries.

FIG. 3 shows an example in which such shape engineering technique has been used according to some embodiments. FIG. 3 shows two shaped engineered TFTs, represented by their channel regions, 320 and 321, created over a crystallized film with periodic grain boundaries 319 that are spaced apart by distance λ. The channel region of TFT 320, for example, is defined as the area between the source and drain areas 323 of that TFT. The channel regions 320 and 321 have been shaped as parallelograms, each with a length L and a width W. Moreover, the channel current for each TFT flows in the direction 325 between source and drain 323. Vertical span 326 for each of the upper and lower edges of the parallelogram is defined as the projection of that edge along the direction perpendicular to the periodic grain boundaries 319. The tilt angle $\theta_3$ of lower and upper edges of the parallelogram is selected such that the vertical span 326 of the lower and upper edges of the parallelogram can be close to an integer multiple of the spacing λ between the perpendicular grain boundaries. The angle $\theta_3$ thus satisfies the general equation (1) below $$\text{Vertical span} = W^* \tan(\theta) = m\lambda \qquad (1)$$

where θ is the tilt angle of the edges, and m is selected with a value close to one, or another integer.

Figure 4:
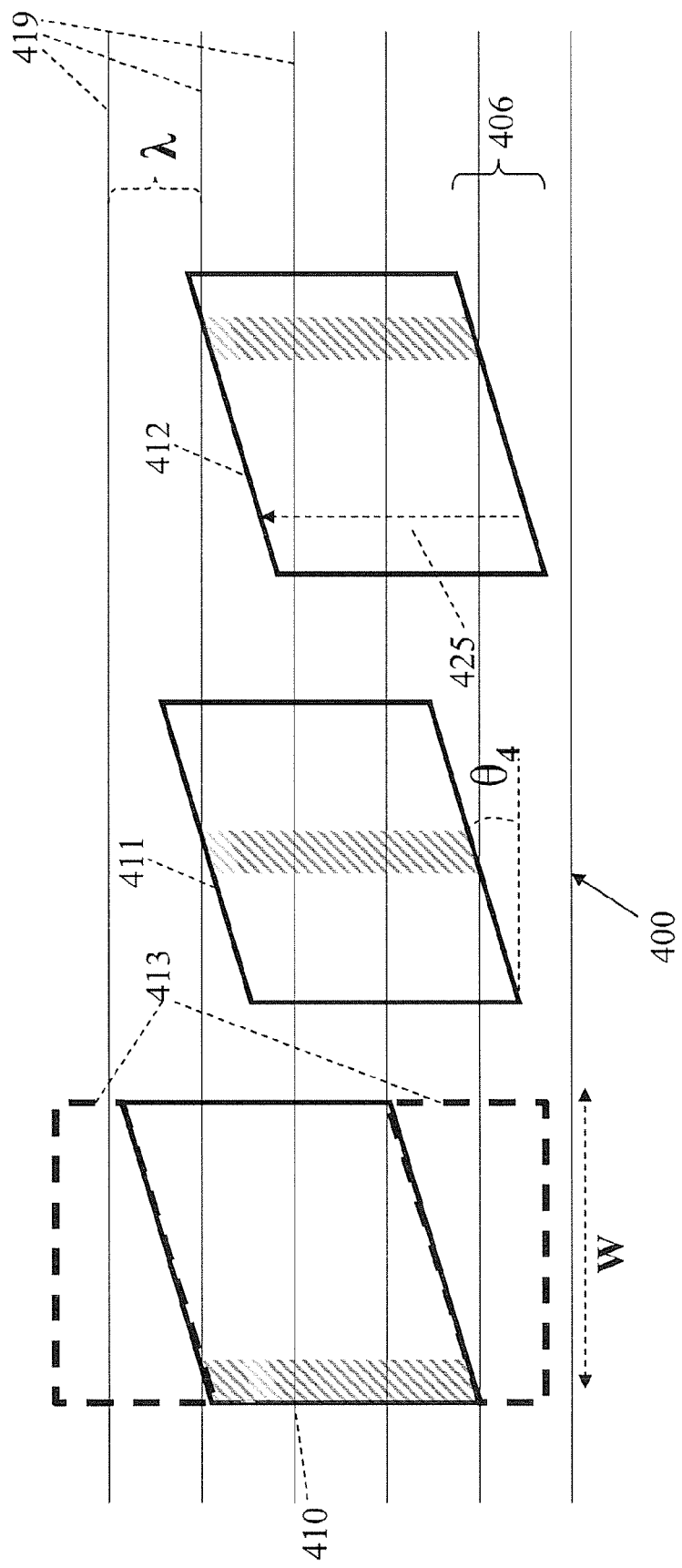
FIG. 4 is a schematic illustration of three shape engineered TFTs on a crystallized film with periodic grain boundaries, according to some embodiments.

FIG. 4 depicts the substantial uniformity of performance achieved by shape engineering according to some embodiments. FIG. 4 shows three identically shaped parallelogram TFTs 410-412, positioned at three different random locations with respect to a crystallized film 400. For example, the shape and position of TFT 410 is defined by the shape and position of its source and drain areas 413. The channel currents for all three TFTs is in the direction 425. The angle $\theta_4$ of the parallelogram satisfies equation (1) with m close to one, that is the vertical span 406 is close to one λ. The shaded areas depict those parts of the channel area where there are two intersecting grain boundaries, and the non-shaded areas depict those parts with three intersecting grain boundaries. For TFTs 410-412, positioned randomly with respect to the grain boundaries 419, the relative location of the shaded, and non-shaded, parts change but the total area of each of these parts stays constant. Thus, the TFTs can maintain a uniform performance.

In some embodiments, TFTs are manufactured by depositing and forming the gate dielectric and metalline contact in the gate area, and then doping the TFT areas, for example as a p-doped region. The presence of the gate substantially masks the gate area from being doped and thus only the source and drain areas will be doped, while the gate area will remain substantially undoped or lightly doped. Finally, the source and drain contacts are formed on their corresponding areas. The source and drain areas are built with the shapes such that the channel area defined between them is in accordance with the shape used in the embodiment. The precise methodology for placing TFTs on the processed thin film is not important to the present invention, and hence any known technique may be employed. One exemplary technique is disclosed in U.S. Pat. No. 5,766,989 to Maegawa et al., the contents of which are incorporated by reference herein.

Shape engineering, unlike tilt engineering methods discussed below, does not require tilting the TFT manufacturing devices with respect to the crystallization devices. The direction of the channel current 325 stays perpendicular to the perpendicular grain boundaries 319 and effectively parallel to the parallel grain boundaries 327. This orientation of the current, minimizes the effect of parallel grain boundaries on the performance of the TFT and makes it possible to control the number of periodically spaced perpendicular grain boundaries intersecting the channel current and thus achieve uniform performance.

Figure 1:
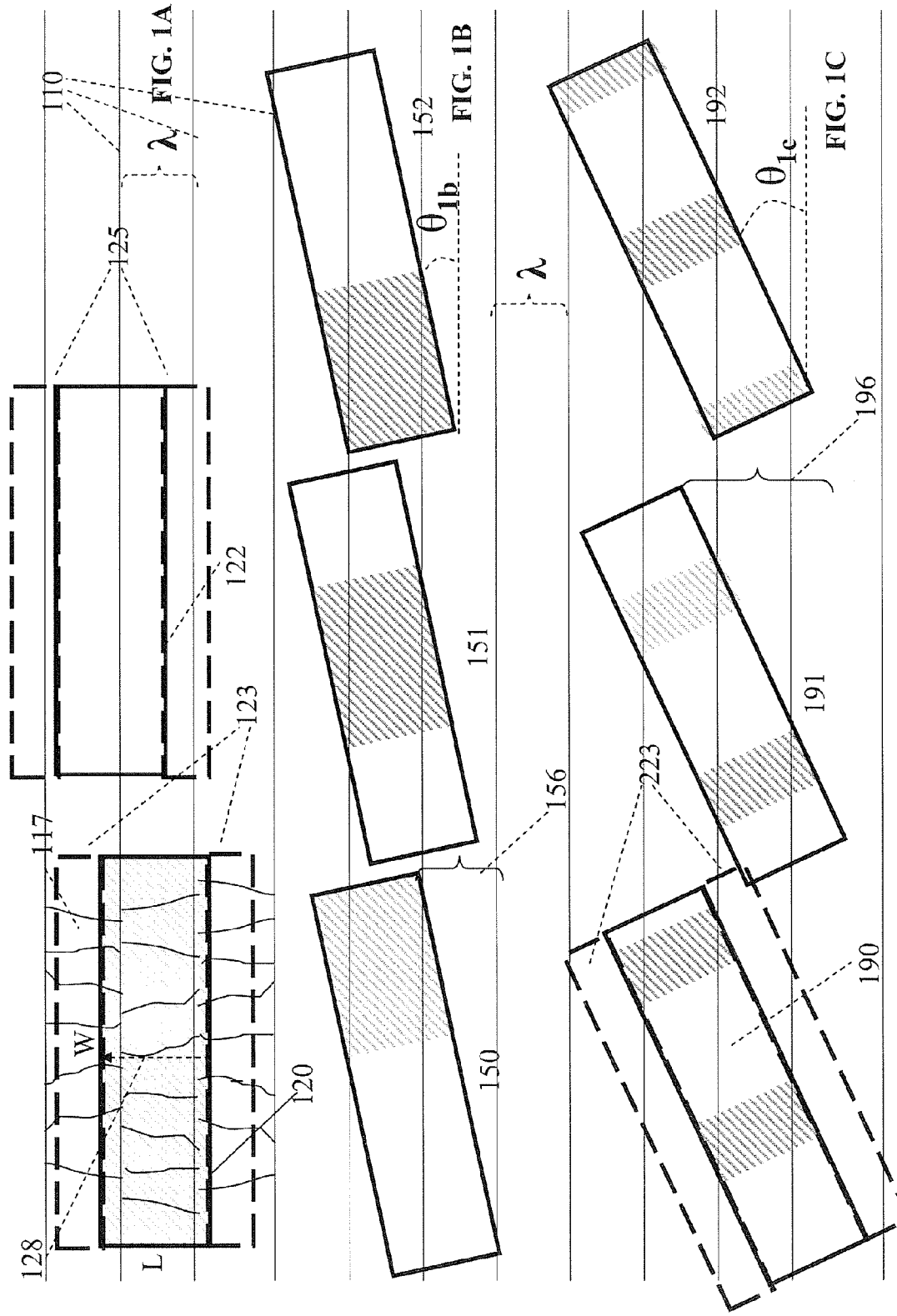
FIGS. 1A-1C are schematic illustrations of TFTs formed at different tilt angles on a crystallized film with periodic grain boundaries.

As seen in FIG. 4, shape engineering, addresses the problem of variation in intersecting grain boundaries encountered in conventional zero angle TFTs, e.g., seen in FIG. 1A. FIG. 1A shows a schematic of zero angle TFTs, that is, rectangularly shaped TFTs oriented such that the upper and lower TFT edges are at zero angle with respect to perpendicular grain boundaries represented by lines 110. Parallel grain boundaries 117 are also shown only for TFT 120, and understood to extend across the crystallized surface in all figures and intersect the perpendicular boundaries 110. While the zero angle TFT setup increases the uniformity by orienting the direction of TFT channels to permit current flow perpendicular to perpendicular grain boundaries, it can not address variation in the number of intersecting grain boundaries due to the random location of the TFTs. As seen for TFTs 120 and 122, the number of grain boundaries that intersect the channel current can differ based on the location of the TFT on the crystal. Specifically, for TFT 120, the channel current crosses two grain boundaries both located very close to the edges and the source and drain regions 123 and 125. On the other hand, for TFT 122, the channel current crosses one grain boundary which is located far from the source and drain regions. As a result, the TFT 120 can have a higher resistance and lower performance that the TFT 122. The variation in number and location of intersecting grain boundaries become more severe as the channel dimensions decreases and becomes comparable to the grain size. In these cases, the TFT typically contains only a small number of grain boundaries and a small variation in that number can introduce a large relative change. For example, in FIG. 1A, TFTs 120 contain two perpendicular grain boundaries compared to TFT 122 which contains one, amounting to a 100% increase.

Shape engineering can also address problems of large tilt angles and small packing numbers encountered in some cases by tilt engineering techniques. In tilt engineering, TFTs channels are rectangular and are placed at an angle tilted with respect to grain boundaries, as is illustrated in FIGS. 1B-1C. The tilt angle is selected such that the TFTs typically contain substantially the same average number of intersecting grain boundaries irrespective of their location on the film. The appropriate tilt angle thus depends on the width of the TFT and the periodicity length of the grain boundaries. Further details regarding tilted TFTs can be found in U.S. patent application Ser. No. 10/487,170, the entire contents of which are incorporated herein by reference. In tilt engineering, in order to achieve a substantially uniform performance among the randomly located TFTs, the vertical span can be chosen to be approximately equal to an integer multiple of the grain spacing λ, that is $$\text{Vertical span} = W^* \sin(\theta) = m\lambda \qquad (2)$$

where θ is the tilt angle and m is an integer or a number close to an integer in value. FIGS. 1B and 1C depict systems in which the TFTs formed on a film are tilted in accordance with equation (2). Specifically, TFTs 150-152 are tilted by an angle $\theta_{1b}$ such that the vertical span 156 is close to the spacing λ, that is m in equation (2) is close to 1. TFTs 190-192 are tilted further by an angle $\theta_{1c}$ such that the vertical span 196 is close to twice the spacing λ, that is m in equation (2) is close to 2. FIG. 1C also shows that the source and drain areas 223 for TFT 190 are created at the same tilt angle $\theta_{1c}$ with respect to the film. The shaded areas indicate areas containing two grain boundaries, and the non-shaded areas indicate areas containing one grain boundary. As can be seen, for each set of TFTs tilted by the same angle and located at random on the film, the shaded area can move around inside the TFT, but the total shaded area and the total non-shaded area stay constant within each set 150-152 and 190-192. Tilt engineering can be accomplished by tilting the placement of the channel region itself on the processed thin film, or alternatively, by fabricating a thin film during SLS processing which includes a tilted periodic grain structure. A combination of both alternatives can also be employed. Exemplary tilt engineering processes and systems are described in commonly-owned U.S. Pat. No. 7,160,763, titled "Polycrystalline TFT uniformity through microstructure mis-alignment."

While tilt engineering can be a useful technique in reaching performance uniformity, tilting is less practical for narrow TFTs, or randomly sized TFTs. Creating a tilt can require the TFT manufacturing instruments to be tilted with respect to the film and crystallization laser and other instruments. For some industrial techniques of crystallization and some laser setups, such tilting of the instruments can decrease efficiency. Moreover, if the device includes TFTs of different widths (W), then according to equation (2) different tilt angles are needed, and thus the TFT manufacturing instruments must change their tilt while creating different TFTs, a change that can be difficult to implement in industrial production.

Tilt engineering can also become less practical for large tilt angles. As the technology progresses and the channels becomes narrower, the required tilt angle increases, posing manufacturing difficulties and also increasing the random effect of parallel grain boundaries. FIG. 2 shows a schematic of a TFT 310, represented by its channel region, that has a small width W relative to the spacing λ. According to equation (2), even for m close to 1, TFT 310 requires a relatively large angle $\theta_2$ such that the vertical span 306 is close to one λ. Large tilt angles, for example, angles close to or larger than 45 degrees, pose a practical difficulty in installing the instruments at those angles. Moreover, for large tilt angles, the TFT performance will be affected by the parallel grain boundaries. As seen for TFT 311, for the large tilt angle $\theta_2$, channel current 315 is no longer effectively parallel to the parallel grain boundaries 317. Instead a large number of the parallel grain boundaries intersect the channel current and thus increase the resistance in the TFT. The number of these intersections depend on the location of the TFT and the parallel grain boundaries and can vary from one TFT to another. These variations increases the variation in performance of TFTs and limits the effect of the tilt.

Avoiding the above difficulties, shape engineered TFTs can introduce a large tilt in the edge of the TFTs to ensure device uniformity while maintaining a current direction that is parallel to the parallel grain boundaries, as seen in FIG. 3. Moreover, shape engineered TFTs, uses a more efficient crystallization process compared to the tilt engineered TFTs, since there is no need to tilt the crystallization instruments with respect to the TFT manufacturing instruments.

Shape engineering also achieves a larger packing efficiency compared to tilt engineering. For example, parallelogram shaped TFT 320 has a smaller packing factor and uses the film more effectively compared to the tilted TFT 310. Due to its tilt, $W_t$, the effective horizontal span of the tilted TFT 310 is significantly larger than W, the horizontal span of the parallelogram shaped TFT 320. As a result, the effective areas of the film used by the shape engineered TFTs is smaller that that used by the tilted TFTs, and in any given area of a device, it is possible to pack many more parallelogram shaped TFTs compared to tilted TFTs. Alternatively, for a fixed number of TFTs used in a device, the shape engineered TFTs require less crystallized area compared to the tilted TFTs.

In addition to parallelogram shapes, other shapes can be employed for shape engineered TFTs according to some embodiments. In some embodiments, the TFTs are shaped as quadrilaterals, for which the side edges are parallel to each other and perpendicular to the periodic grain boundaries. The based edges of the quadrilateral, on the other hand, are positioned at two different tilt angles with respect to the grain boundaries, such that each tilt angle separately satisfies equation (1) with a value for m that is different from that of the other angle. Thus the vertical span of the lower edge can be different from the vertical span of the upper edge. For example, one such quadrilateral can be formed by modifying the parallelogram of FIG. 3 such that the upper and lower edges have different tilt angles and thus are not parallel with each other.

Figure 5:
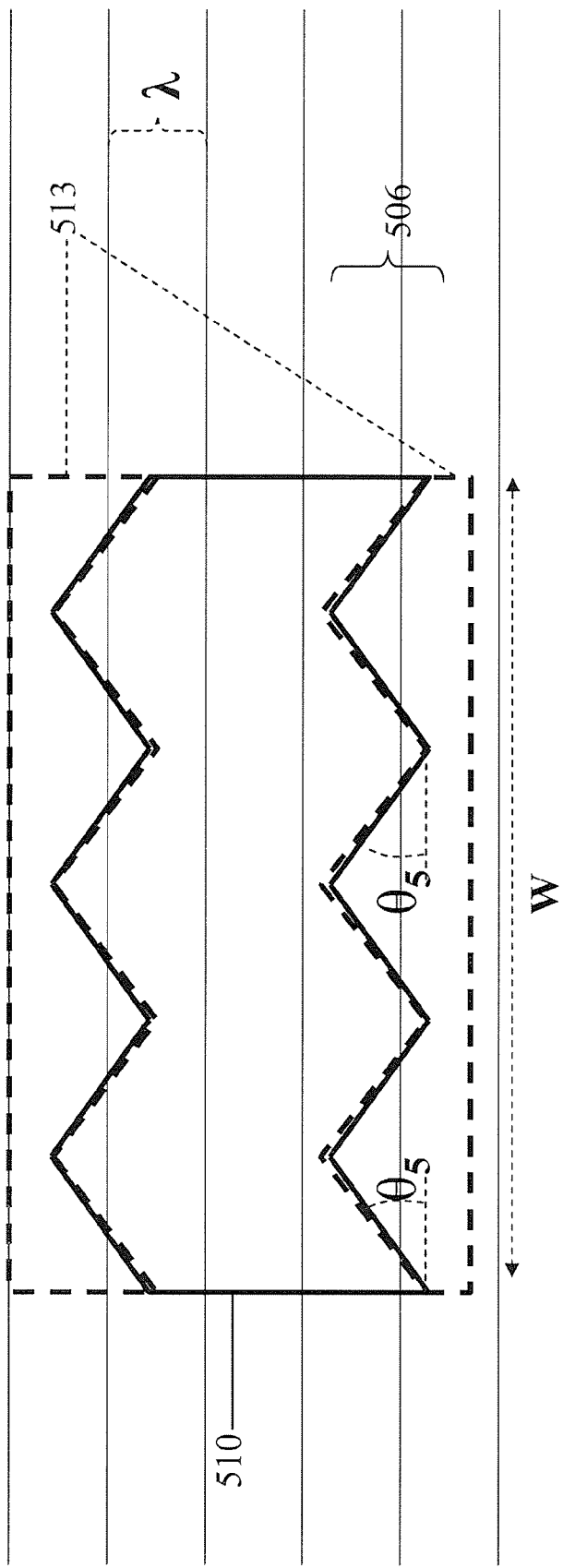
FIG. 5 is a schematic illustration of a shape engineered TFT with zig-zag shaped edges on a crystallized film with periodic grain boundaries, according to some embodiments.

In yet some other embodiments the TFTs are shaped such that one or both of the edges include multiple intersecting angled sub-edges. In yet other embodiments, the TFTs have edges with other irregular shapes. FIG. 5 depicts a shape engineered TFT 510 according to some embodiments. In TFT 510, the upper and lower edges of the channel region, defined by the source and drain areas 513, are shaped in the form of two edges that include multiple sub-edges (the so-called zig-zag). The tilt angle $\theta_5$ for each of the sub-edges of is defined as the smaller angle between that sub-edge and the direction of the periodic grain boundaries. The tilt angles for the shape in FIG. 5 are selected all to be equal to $\theta_5$ such that the vertical span 506 of the lower and upper edges of the parallelogram can be close to an integer multiple of the spacing $\lambda$ between the perpendicular grain boundaries. The angle $\theta_5$ thus satisfies the general equation (3) below $$\text{Vertical span} = W^* \tan(\theta)/n = m\lambda \quad (3)$$

where n is the number of sub-edges, and where m is selected to have a value close to an integer. Specifically for FIG. 5, the value of n is 6, and the value of m is close to one. In some embodiments, the sub-edges might have different angles. Other geometries may also be contemplated, which provide an approximately constant number of intersecting grain boundaries among different randomly placed TFTs.

In some embodiments, one or both of the upper and the lower edges can include multiple sub-edges, for which the tilt angles are not the same. For example, in an embodiment, the edge has a "saw-tooth" shape, in which the tilt angle for the sub-edges alternates between a value below 90 degrees and a value equal to 90 degrees. In some other embodiments, the sub-edges could be inter-connected with line segments that are oriented at zero tilt angles, and thus with zero vertical span. In some other embodiments, for each of the sub-edges the vertical span is an integer multiple of the spacing.

In some embodiments, a combination of tilt engineering and shape engineering can be employed to create shape engineered TFTs that are also tilted with respect to the film. In some embodiments, the angle of the parallelogram can be selected to be large, such that the angle satisfies equation (1) or equation (3) with the value of m close to an integer greater than one, for example two. Larger values of m are especially recommended for films with non-uniform grain boundaries.

One source of non-uniformity in crystallized films created by the 2D system, can be non-uniformity in the radiation power of the rectangular shaped laser beam. In the 2D systems, the beam is elongated in order to extend the scanned region and reduce the stage scan velocity. While such elongation increases the throughput rate, it can reduce the uniformity of the radiation power, since it can be difficult to have the same projection properties in regions far off the laser axis compared to regions near the axis. Thus elongating the beam can cause the power of the laser beam to be reduced in areas closer to the edges. Non-uniformity in the radiation power of the laser can in turn cause a non-uniformity in the characteristics of the melted film and the resulting crystal.

In some embodiments, in order to reduce the relative effect of the variation in the number of grain boundaries, larger TFTs, and more specifically TFTs with larger length L, are utilized. Larger TFTs typically contain a larger number of perpendicular grain boundaries. As a result, their properties can result from averaging the properties of a large number of individual grain boundaries. Moreover a variation of one in the number of grain boundaries causes a small relative change in the total number of grain boundaries and a small relative variation in the performance of the TFT.

In other embodiments, the device uniformity is increased by reducing crystalline grain size, with respect to device dimensions, so that more effective averaging takes place. Such setups can be useful in particular for future display products and AMOLED displays. Conceptually, shorter grains (smaller spacing between the perpendicular grain boundaries) can be achieved by reducing the beam width, e.g., the "short axis" of the beam width, so that lateral growth fronts collide sooner. Reduced beam width can for example be achieved by reducing the width of the pattern to be projected, possibly in combination with reducing radiation intensity. However, in practice this is not easy because of resolution limitations of the projection systems used. A higher resolution is achieved only at the expense of a reduced depth of focus. Given beam dimensions (e.g., as long as the width of a Gen4 panel) and roughness of the panel this is problematic. Similar issues are found with non-projection systems in which the beam is focused in a narrow line. Here, the additional issue is that a Gaussian beam profile is less preferred because the crystallization is more sensitive to pulse-to-pulse power.

In some embodiments, a laser beam with an intensity profile that is asymmetric along its short axis is utilized to create smaller grains. FIG. 6(c) shows an example of the intensity profile of such a beam. In some embodiments, an asymmetric beam profile can be created by shifting the incident beam which is directed into the projection lens from the center of the lens. The shift causes the aberration and creates an asymmetric intensity beam. In other embodiments, an asymmetric beam profile is created by directing an incident beam into the beam-width-defining slit. In yet other embodiments, an asymmetric beam can be generated by modifying the position of optic elements, for example, projection lens, slit, homogenizer etc., to redistribute the intensity of laser energy within the width of the beam.

Figure 6:
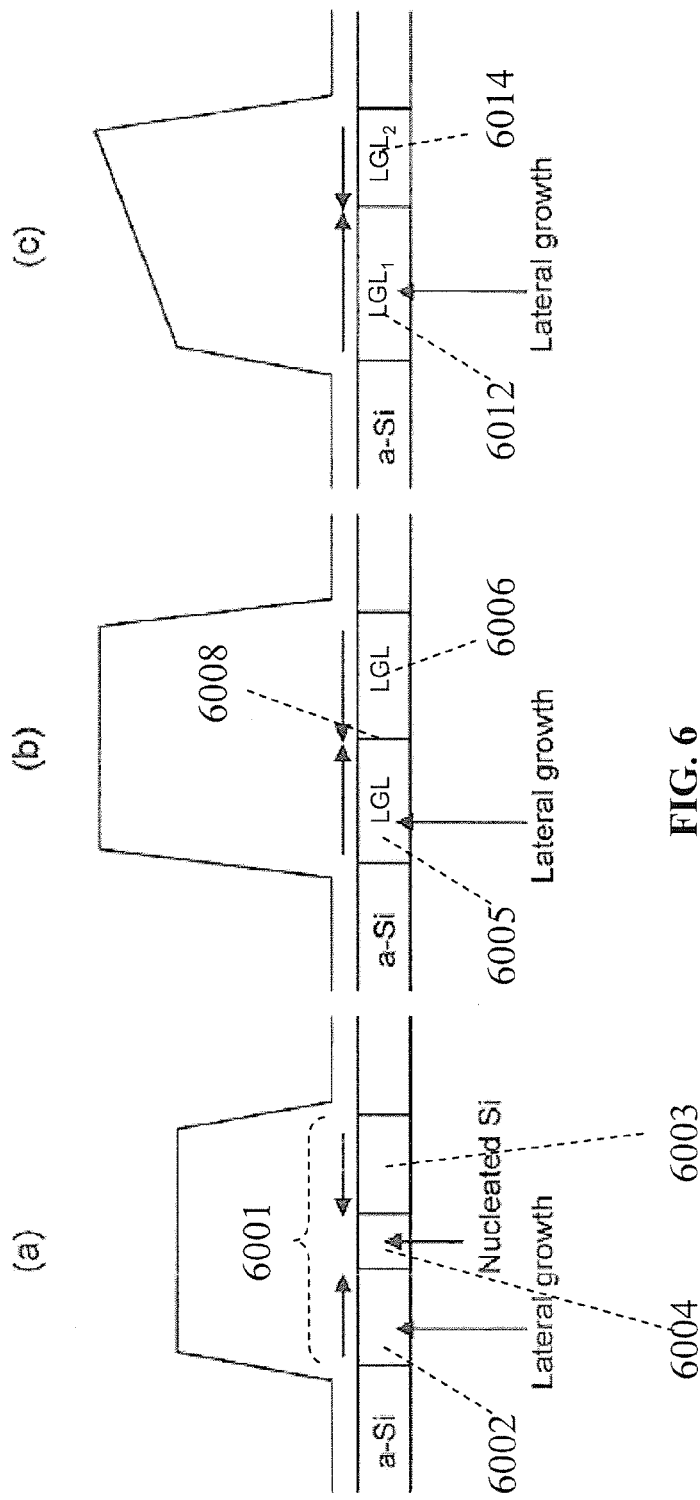
FIG. 6 depicts the effect of different beam profiles on crystallization.

The effect of different short-axis beam profiles is shown in FIG. 6. A low intensity beam, as in FIG. 6(a), results in a limited lateral growth. The region 6001 melts by the beam. Upon removal of the beam, region 6001 laterally crystallized into regions 6002 and 6003. Due to the low energy of the beam, the crystallized regions 6002 and 6003 complete their crystallization before meeting each other, and there forms a non-crystallized nucleated silicon region 6004 between them. The reduced beam energy therefore results in smaller lateral grain growth, but limits to beam resolution prevents practical application of such beam. The nucleated region can be avoided by reducing the beam width, but such reduction might be not feasible as explained before. A higher intensity beam, as in FIG. 6(b), results in a larger lateral growth length. In this case, the laterally crystallized regions 6005 and 6006 meet along a grain boundary 6008, and there is no nucleated silicon region. In some embodiments, a low intensity can be around 1.3 times the complete melting intensity, while a high intensity can be around 1.9 time the complete melting intensity. The complete melting intensity depends on film thickness and pulse duration. In some embodiments, the typical value of the complete melting intensity is around 0.4 to 0.9 Joules/cm$^2$.

An asymmetric intensity beam as shown in FIG. 6(c), however, can provide both a longer and shorter lateral growth compared to a high energy density profile, like that of FIG. 6(b). Specifically, growth on the cool side, i.e., left hand side in FIG. 6(c), may proceed more quickly than on the hot side, i.e., the right hand side, while nucleation is still effectively suppressed in the hottest region. As a result, the lateral growth on the less intense side of the beam, i.e., the left hand side in the example of FIG. 6(c), is longer than that on the more intense side of the beam, i.e., the right hand side. This results in asymmetric lateral growth, in which the lateral growth LGL1 for region 6012 is larger than the lateral growth length LGL2 for region 6014.

Systems with asymmetric intensity beams can for example be used for crystallizing Gen4 panels with a high throughput. In such systems aiming at creating directionally solidified materials, one can increase the in-between-pulse translation distance (the relative displacement of the beam with respect to the film) by increasing the sample translation velocity and thereby achieve higher throughput.

In some embodiments, utilizing the 2-Shot SLS techniques, the asymmetric beam can be used to reduce crystalline grain size. FIGS. 7A-7C depict the beam progress in a 2-Shot SLS method using a symmetric beam. In such a system, the beam moves by a displacement D which is between LGL and 2LGL. The resulting periodic grain boundaries are distanced apart by the value of displacement D.

FIGS. 8A-8C depict the beam progress in a 2-Shot SLS method using an asymmetric beam, according to some embodiments. In such a system, the beam moves to the left, that is in a direction of the larger grains. For a 2-Shot SLS system, the value of the displacement D, has to be between LGL2, and LGL1+LGL2, which is the total width of the beam. The resulting periodic grain boundaries are still distanced apart by the value of displacement D. By choosing a displacement D' to be close to LGL2, one can therefore create periodic boundaries that are closer together than that of the system of FIG. 7C. Thus, shorter grains are created without compromising the depth of focus. Typically D' is selected to be equal to LGL2+δ where δ is chosen to be small, but such that the overlap between consecutive irradiations reduces the effect of variations in the intensity of the beam along beam's edges. In some embodiments, where the beam width is typically between 4 to 10 microns, δ is can typically be around 0.2 to 0.5 microns.

Throughput in FIGS. 8A-8C would be lower than FIGS. 7A-7C, which uses the symmetric beam to create longer grains, because the displacement in FIGS. 8A-8C is chosen to be smaller than FIGS. 7A-7C. On the other hand, in a system using directional SLS method with a symmetric beam, the displacement must be selected to be less than LGL, half of the beam width. Thus, the throughput in FIGS. 8A-8C may still be comparable or better than that of the directional SLS using the asymmetric beam if the displacement in FIGS. 8A-8C is comparable or larger than that of the latter system.

In some embodiments, a performance non-uniformity is caused by a variance in the power of a two dimensional (2D) laser beam. In order to reduce this type of non-uniformity, in some embodiments, a smaller aspect ratio is used for the beam, reducing the ratio of the beam's length to its width, and creating a laser beam with a shape closer to a square. A smaller aspect ratio beam makes more use of the central parts of the lenses focusing the beam, as opposed to the outer, less perfect, parts of the lenses. Such technique can specifically be useful for laser setups such as the 2D-laser system sold by JSW.

While there have been shown and described examples of the present invention, it will be readily apparent to those skilled in the art that various changes and modifications can be made therein without departing from the scope of the invention. Those skilled in the art will recognize, or be able to ascertain, using no more than routine experimentation, numerous equivalents to the specific compositions and procedures described herein, for example by combining or rearranging elements or embodiments. Such equivalents are considered to be within the scope of this invention, and are covered by the following claims.

The invention claimed is:

1. A thin film transistor (TFT) comprising:
   a channel area disposed in a crystalline substrate, said crystalline substrate comprising a plurality of grain boundaries that are approximately parallel with each other and are spaced apart with approximately equal spacings, λ,
   wherein the shape of the channel area comprises a non-equiangular polygon, the polygon having two opposing side edges that are oriented substantially perpendicular to the plurality of grain boundaries and an upper edge and a lower edge, wherein at least a portion of each of the upper and lower edges is oriented at a tilt angle with respect to the plurality of grain boundaries that is greater than 0 and less than or equal to 90 degrees, the tilt angles for the portion of each edge of the upper and lower edges selected such that the number of grain boundaries covered by the polygon is independent of the location of the channel area within the crystalline substrate.

2. The TFT of claim 1, wherein the polygon comprises a concave polygon.

3. The TFT of claim 1, wherein the polygon comprises a convex polygon.

4. The TFT of claim 1, wherein the tilt angles for the portion of each edge of the upper and lower edges are the same.

5. The TFT of claim 1, wherein the tilt angles for the portion of each edge of the upper and lower edges are different.

6. The TFT of claim 1, wherein the polygon comprises a parallelogram.

7. The TFT of claim 6, wherein the upper and lower edges are substantially parallel with each other, and wherein the tilt angles for the upper and lower edges of the parallelogram are selected such that the vertical span for each of the upper and lower edges is about an integer multiple of the spacing between the grain boundaries.

8. The TFT of claim 7, wherein the tilt angle θ for the upper and lower edges, the approximately equal spacing λ among the grain boundaries, and the distance W between the two side edges, satisfy the equation, W*tan(θ)=mλ, with the value of m about an integer.

9. The TFT of claim 7, wherein m is about 1.

10. The TFT of claim 7, wherein m is about an integer greater than 1.

11. The TFT of claim 1, wherein the polygon comprises a quadrilateral.

12. The TFT of claim 11, wherein the upper and lower edges of the quadrilateral are not parallel with each other, and wherein the tilt angles for the upper and lower edges of the parallelogram are selected to be different, such that the vertical spans for the upper and lower edges are about different integer multiples of the spacing between the grain boundaries.

13. The TFT of claim 12, wherein the tilt angle θ for the upper edge or the lower edge of the quadrilateral, the approximately equal spacing λ among the grain boundaries, and the distance W between the two side edges, satisfy the equation, W*tan(θ)=mλ, with the value of m about an integer.

14. The TFT of claim 1, further comprising a source area and a drain area each adjacent to one of the upper and lower edges.

15. The TFT of claim 1, wherein at least one of the upper and lower edges comprises a plurality of line segments, and wherein one or more of the line segments has a tilt angle with respect to the plurality of grain boundaries that is greater than 0 and less than or equal to 90 degrees, the tilt angles for each of the one or more line segments selected such that the number of grain boundaries covered by the polygon is independent of the location of the channel area within the crystalline substrate.

16. The TFT of claim 12, wherein the tilt angle for each of the one or more line segments is selected such that the vertical span for that line segment is about an integer multiple of the spacing between the grain boundaries.

17. The TFT of claim 12, wherein one of the upper and lower edges comprises of n line segments each having the same tilt angle θ and connects an end of a first side edge to an end of a second side edge, and for a distance W between the two side edges, the tilt angle θ satisfies the equation W*tan(θ)/n=mλ, with the value of m close to an integer.

18. A system for processing a film, the system comprising:
a laser source providing a of laser beam;
laser optics that shape the laser beam into a line beam having a fluence which causes an irradiated portion of the film to melt throughout its thickness, and wherein the irradiated portion of the film has a long axis and a short axis, and further wherein the laser beam has an intensity profile that is asymmetric such that the intensity of the laser beam changes from a first end of the short axis to a second end of the short axis
a stage for supporting the film and capable of translation in at least the x-direction; and
instructions stored in computer readable medium, the instructions comprising:
irradiating a first portion of the film with the laser beam in order to melt the first portion of the film;
permitting the first portion to laterally solidify, wherein the solidified first portion includes a first column of laterally grown crystal grains, the first column formed parallel to the long axis on a first side of the first portion covering the first end of the short axis, and the second column formed parallel to the long axis on a second side of the first portion covering the second end of the short axis, and wherein when measured in the direction of the short axis a first average length of crystal grains in the first column is larger than a second average length of crystal grains in the second column; and
irradiating a second portion of the film with the laser beam in order to melt the second portion, wherein the second portion is laterally displaced by a displacement with respect to the first portion, wherein the displacement is parallel to the short axis and in the direction going from the second end to the first end of the short axis, and further wherein the value of the displacement is larger than the second average length and smaller than the sum of the first and the second average lengths.

19. A method of preparing a polycrystalline film comprising:
providing a substrate having a thin film disposed thereon, said film capable of laser-induced melting;
generating a laser beam for irradiating the film, wherein the laser beam is a line beam which causes the irradiated portion of the film to melt throughout its thickness, and wherein the irradiated portion of the film has a long axis and a short axis, and further wherein the laser beam has an intensity profile that is asymmetric such that the intensity of the laser beam changes from a first end of the short axis to a second end of the short axis;
melting a first portion of the film by irradiating the first portion with the laser beam;
permitting the first portion to laterally solidify, wherein the solidified first portion includes a first column and a second column of laterally grown crystal grains, the first column formed parallel to the long axis on a first side of the first portion covering the first end of the short axis, and the second column formed parallel to the long axis on a second side of the first portion covering the second end of the short axis, and wherein when measured in the direction of the short axis a first average length of crystal grains in the first column is larger than a second average length of crystal grains in the second column; and
melting a second portion of the film by irradiating the second portion with the laser beam, wherein the second portion is laterally displaced by a displacement with respect to the first portion, wherein the displacement is parallel to the short axis and in the direction going from the second end to the first end of the short axis, and further wherein the value of the displacement is larger than the second average length and smaller than the sum of the first and the second average lengths.

20. The method of claim 19, wherein the intensity profile of the laser beam is a linear profile which changes linearly from the first end of the short axis to the second end of the short axis, and remains almost constant along the long axis.

21. A method of manufacturing a plurality of thin film transistors (TFTs) on a crystalline substrate, wherein the plurality of TFTs are disposed in a crystalline substrate, said crystalline substrate having a plurality of grain boundaries that are approximately parallel with each other and are spaced apart with approximately equal spacings, $\lambda$, the method comprising:

forming a channel region of each TFT of the plurality of TFTs in a shape which comprises a non-equiangular polygon, the polygon having two opposing side edges that are oriented substantially perpendicular to the plurality of grain boundaries and an upper edge and a lower edge, wherein at least a portion of each of the upper and lower edges is oriented at a tilt angle with respect to the plurality of grain boundaries that is greater than 0 and less than or equal to 90 degrees, the tilt angles for the portion of each edge of the upper and lower edges selected such that the number of grain boundaries covered by the polygon is independent of the location of the channel area within the crystalline substrate.

\* \* \* \* \*

UNITED STATES PATENT AND TRADEMARK OFFICE
CERTIFICATE OF CORRECTION

| | | |
|---|---|---|
| PATENT NO. | : 8,415,670 B2 | Page 1 of 1 |
| APPLICATION NO. | : 12/679543 | |
| DATED | : April 9, 2013 | |
| INVENTOR(S) | : James S. Im | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 332 days.

Signed and Sealed this
Eighteenth Day of June, 2013

Teresa Stanek Rea
*Acting Director of the United States Patent and Trademark Office*

UNITED STATES PATENT AND TRADEMARK OFFICE
CERTIFICATE OF CORRECTION

PATENT NO.        : 8,415,670 B2                                                                                              Page 1 of 1
APPLICATION NO. : 12/679543
DATED             : April 9, 2013
INVENTOR(S)       : James S. Im It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 430 days.

Signed and Sealed this
First Day of September, 2015

Michelle K. Lee
*Director of the United States Patent and Trademark Office*